(12) United States Patent
Atnip et al.

(10) Patent No.: US 11,511,989 B2
(45) Date of Patent: Nov. 29, 2022

(54) MEMS VIA WITH ENHANCED ELECTRICAL AND MECHANICAL INTEGRITY

(71) Applicant: Texas Instruments Incorporated, Dallas, TX (US)

(72) Inventors: Earl Vedere Atnip, Plano, TX (US); John Wesley Hamlin, Dallas, TX (US); Win Jae Jessie Yuan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 127 days.

(21) Appl. No.: 16/294,399

(22) Filed: Mar. 6, 2019

(65) Prior Publication Data

US 2020/0207609 A1 Jul. 2, 2020

Related U.S. Application Data

(60) Provisional application No. 62/786,418, filed on Dec. 29, 2018.

(51) Int. Cl.
*B81B 3/00* (2006.01)
*B81C 1/00* (2006.01)
*G02B 26/08* (2006.01)

(52) U.S. Cl.
CPC .......... *B81B 3/007* (2013.01); *B81C 1/00658* (2013.01); *G02B 26/0833* (2013.01); *B81B 2201/042* (2013.01); *B81B 2207/07* (2013.01); *B81C 2201/0109* (2013.01); *B81C 2201/0132* (2013.01); *B81C 2201/0176* (2013.01)

(58) Field of Classification Search
CPC ................ B81B 3/007; B81B 2207/07; B81B 2201/042; B81B 7/007; B81B 2203/0307; G02B 26/0833; G02B 26/0841; G02B 7/182; G02B 7/1821; G02B 26/0816–0866
See application file for complete search history.

(56) References Cited

U.S. PATENT DOCUMENTS

| 5,631,782 A * | 5/1997 | Smith | G02B 26/0841 359/871 |
|---|---|---|---|
| 2007/0035807 A1* | 2/2007 | DiCarlo | G02B 26/0841 359/291 |
| 2007/0242343 A1* | 10/2007 | Roth | G02B 5/0858 359/291 |
| 2008/0137170 A1* | 6/2008 | Rothenbury | G02B 26/0833 359/290 |
| 2009/0231671 A1* | 9/2009 | Yang | G02B 26/0841 359/290 |
| 2014/0285060 A1* | 9/2014 | Yamazaki | B81B 3/0075 216/13 |
| 2016/0291317 A1* | 10/2016 | Ito | G02B 26/008 |

* cited by examiner

*Primary Examiner* — Kimberly N. Kakalec
(74) *Attorney, Agent, or Firm* — Michelle F. Murray; Charles A. Brill; Frank D. Cimino

(57) ABSTRACT

Described examples include a micromechanical device having a substrate. The micromechanical device includes a MEMS element and a via between the MEMS element and the substrate, the via having a conductive layer extending from the substrate to the MEMS element and having a structural integrity layer on the conductive layer.

20 Claims, 22 Drawing Sheets

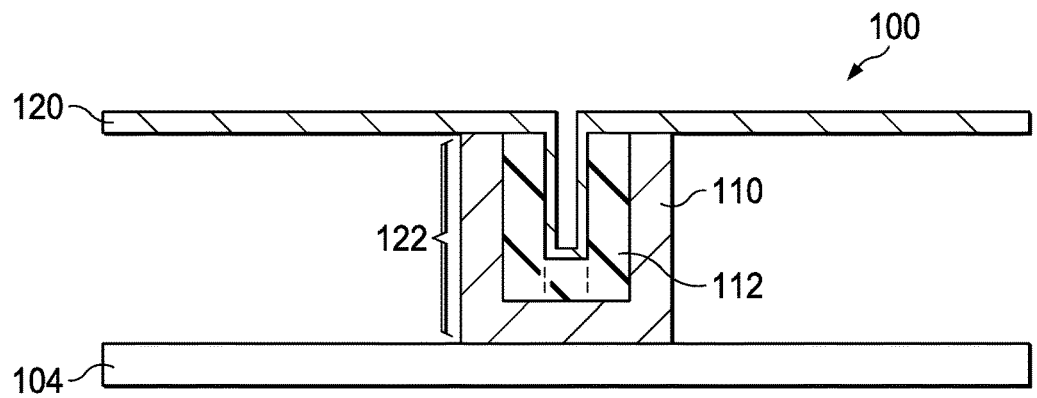
FIG. 1
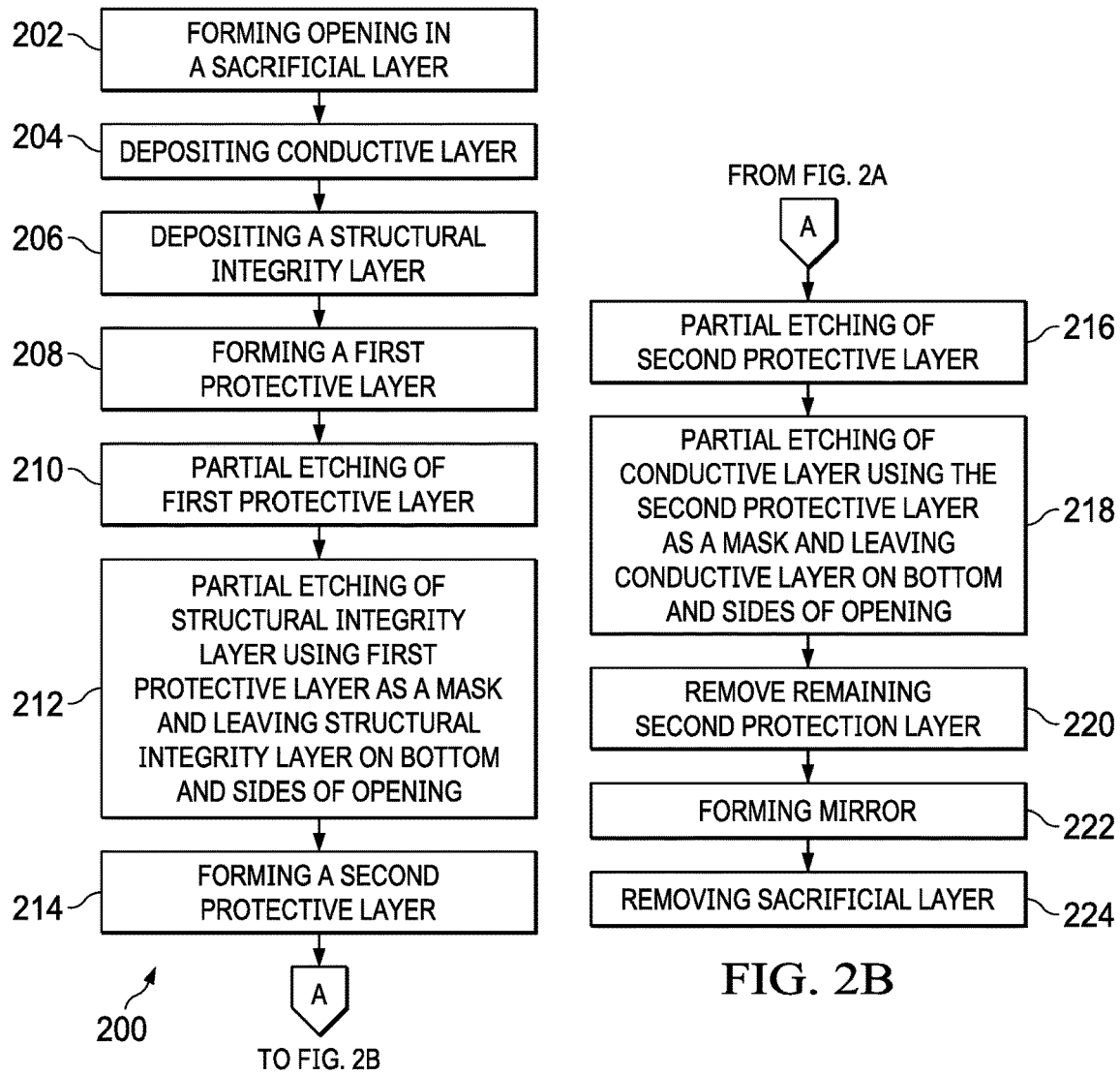
FIG. 2A
FIG. 2B

MEMS VIA WITH ENHANCED ELECTRICAL AND MECHANICAL INTEGRITY

CROSS REFERENCE TO RELATED APPLICATIONS

This application claims the benefit under 35 U.S.C. § 119(e) to co-owned U.S. Provisional Patent Application Ser. No. 62/786,418, filed Dec. 29, 2018, titled "MEMS VIA WITH ENHANCED ELECTRICAL AND MECHANICAL INTEGRITY," which is hereby incorporated by reference in its entirety herein.

TECHNICAL FIELD

This relates generally to microstructures, and more particularly to examples of microelectromechanical systems (MEMS) devices.

BACKGROUND

One type of MEMS device is a micromirror. Micromirror-based systems display images by projecting the images onto a display plane. A digital micromirror device (DMD), such as a Texas Instruments DLP® micromirror device, is an example of a MEMS device that has an array of micromirror light modulators. Those micromirrors are individually actuable in respective "ON" or "OFF" positions to collectively form an image. Using a pulse-width modulation technique, the image is controlled by bit planes (generated per image frame), based on imaging data that the DMD receives per pixel position (such as 8-bit red-green blue (RGB) data per pixel per frame). In the "ON" position, the micromirror reflects incident light onto the display plane (or other display target). In the "OFF" position, the micromirror reflects incident light away from the display plane. During the image frame display period (eye integration time): (a) the color (chroma) of each displayed pixel is controlled by relative proportions of different primary and/or secondary colors of incident light directed onto the display plane; and (b) the intensity (lumina) of each displayed pixel is controlled by a relative proportion of "ON" time vs. "OFF" time for the pixel's respective micromirror (i.e., total of the weighted bit-position subinterval display times in which a "1" appears for the corresponding pixel in the series of bit planes for that frame).

In a micromirror MEMS structure, a via (post) or other underlying support structure supports the pixel's respective micromirror above a substrate. The micromirror structure allows for micromirror movement between the "ON" and "OFF" positions in response to electrostatic forces, which are applied by associated complementary metal-oxide semiconductor (CMOS) integrated circuitry. This movement causes stress in DMDs and in other MEMS devices. Therefore, there is a need for stronger vias.

SUMMARY

In accordance with an example, a micromechanical device includes a substrate. The micromechanical device includes a MEMS element and a via between the MEMS element and the substrate, the via having a conductive layer extending from the substrate to the MEMS element and having a structural integrity layer on the conductive layer. In another example, the MEMS element is a mirror.

BRIEF DESCRIPTION OF THE DRAWINGS

FIG. 1 is a diagram of an example MEMS device.

FIGS. 2A and 2B (collectively "FIG. 2") is a flow diagram of an example process forming the example MEMS device of FIG. 1.

DETAILED DESCRIPTION

Figure 3A:
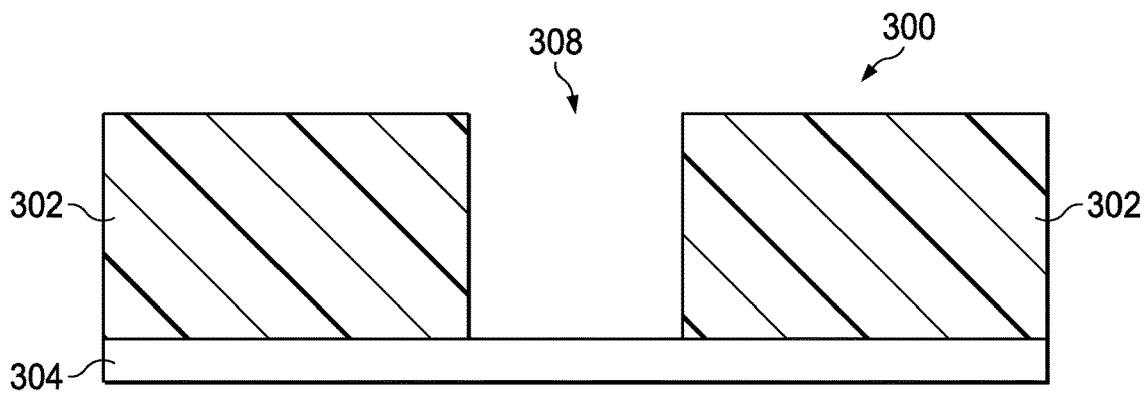
FIGS. 3A through 3L (collectively "FIG. 3") are diagrams showing the steps of the example process of FIG. 2 for forming the example MEMS device of FIG. 1.

In the drawings, corresponding numerals and symbols generally refer to corresponding parts unless otherwise indicated. The drawings are not necessarily drawn to scale.

As used herein, the term "coupled" may include connections made with intervening elements, and additional elements and various connections may exist between any elements that are "coupled." As also used herein, the term "on" may include intervening elements between an element and that which the element is "on." In addition, as also used herein, the term "via" means a structure to provide mechanical and/or electrical connection between levels in a MEMS device. As indicated hereinbelow, a "via" and a "post" are synonymous as used herein.

The examples described hereinbelow address the problem of strengthening vias by providing a more robust via structure. Examples herein include processes to electrically and mechanically improve vias without perturbation to the integrity or functionality of the critical MEMS elements, such as hinges and mirrors. In one example, a MEMS device includes a substrate. The micromechanical device includes a MEMS element and a via between the MEMS element and the substrate, the via having a conductive layer extending from the substrate to the MEMS element and having a structural integrity layer on the conductive layer.

FIG. 1 shows an example MEMS device 100. Examples of MEMS devices include sensors (e.g., temperature, pressure, gas, moisture, and motion sensors), accelerometers, valves, motors, actuators, and micromirrors. In this example, MEMS device 100 is an electrically-actuated, movable micromirror. In this example, MEMS device 100 is part of an integrated circuit. In other examples, MEMS device 100 is not part of an integrated circuit or is part of a hybrid circuit package. Via 122 (or post 122) is between substrate 104 and a MEMS element, such as mirror 120. In this example, substrate 104 is a hinge. The other portions of the hinge are not shown for simplicity of explanation. In other examples, substrate 104 is a semiconductor substrate or a substrate of another material. As used herein, "substrate" means any material or structure used to support another structure. Via 122 includes conductive layer 110 and structural integrity layer 112. As used herein, a "conductive layer" is a layer of material that is electrically conductive, such as aluminum, copper, titanium, titanium nitride, titanium aluminum, and other conductive materials. As also used herein, a "structural integrity layer" is a layer of material to provide mechanical strength, such as silicon dioxide, silicon nitride and others. An example process for fabricating MEMS device 100 is described hereinbelow.

FIGS. 2A and 2B (collectively "FIG. 2") is a flow diagram of an example process 200, the steps of which are illustrated in FIGS. 3A through 3L (collectively "FIG. 3"). FIG. 3 shows the steps in forming MEMS device 300, which is like MEMS device 100 (FIG. 1). Step 202 is forming opening 308 in sacrificial layer 302. FIG. 3A shows sacrificial layer 302 formed over substrate 304. In this example, sacrificial layer 302 is silicon dioxide formed to a thickness of about 5,000 Å. Sacrificial layer 302 is a material that can be selectively removed in subsequent steps. In this example, sacrificial layer 302 is a silicon dioxide layer. Examples of materials for first sacrificial layer 302 include silicon dioxide, silicon nitride, photoresist, polyimide, germanium, germanium oxide, polycrystalline silicon, phosphor-silicateglass (PSG), borophosphosilicate glass (BPSG) and spin-on-glass (SOG). In this example, substrate 304 is a hinge. The other portions of the hinge are not shown for simplicity of explanation. In other examples, substrate 304 is a semiconductor substrate or a substrate of another material. Photolithography and an anisotropic etch process such as plasma etching, patterns sacrificial layer 302 to form opening 308. As further shown hereinbelow, the length of the via 322 (FIG. 3L) is determined by the thickness of sacrificial layer 302. In this example, the via will have a length of about 5,000 Å. Other via lengths may selected based on structural and other design considerations. In some examples, opening 308 is circular as viewed from the top of the page with FIG. 3A and thus opening 308 is cylindrical. In some examples, opening 308 exposes a contact (not shown) in substrate 304.

Figure 3B:
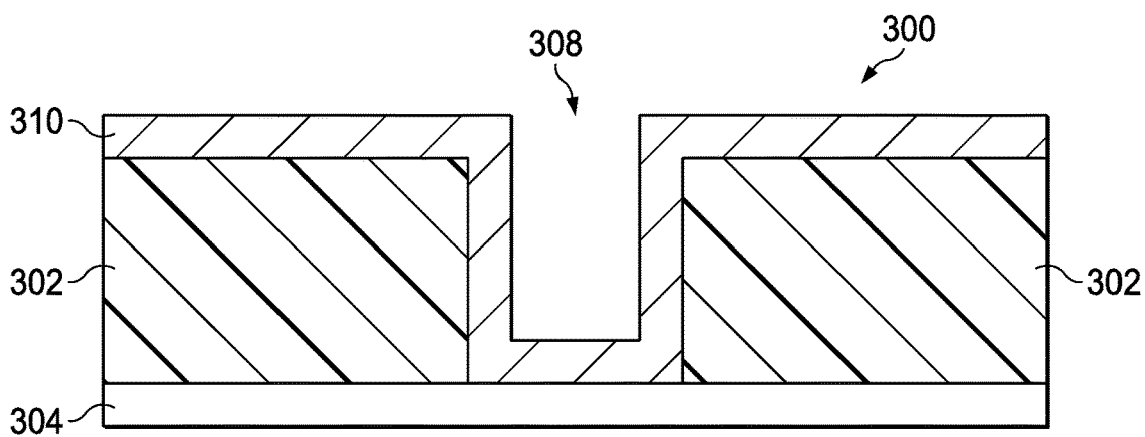

Step 204 is depositing conductive layer 310. FIG. 3B shows conductive layer 310 formed on the surface of sacrificial layer 302 and on the sides of sacrificial layer 302 in opening 308 and on substrate 304 at the bottom of opening 308. In an example, conductive layer 310 is selected from the group of titanium nitride (TiN) and titanium-aluminum (TiAl), and is formed using chemical vapor deposition (CVD) or physical deposition to a thickness 300 to 400 Å. As an example, the material of conductive layer 310 is selected for good conductivity and for good coverage of vertical surfaces (e.g., the sides of sacrificial layer 302 in opening 308) and horizontal surfaces.

Figure 3C:
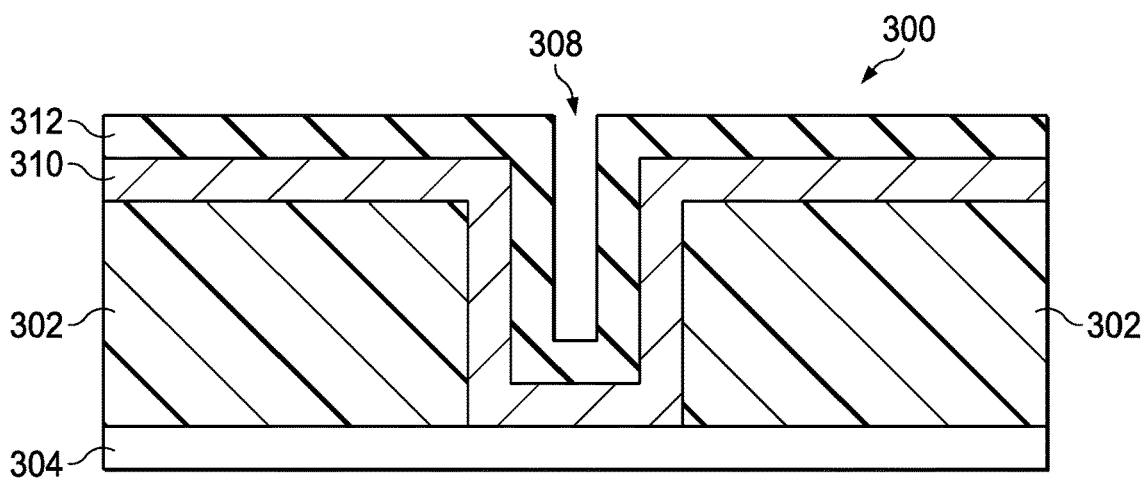

Step 206 is depositing structural integrity layer 312. FIG. 3C shows structural integrity layer 312 formed over conductive layer 310. In an example, chemical vapor deposition of silicon dioxide, silicon nitride or another suitable material forms structural integrity layer 312 to a thickness of about 3,000 Å.

Figure 3D:
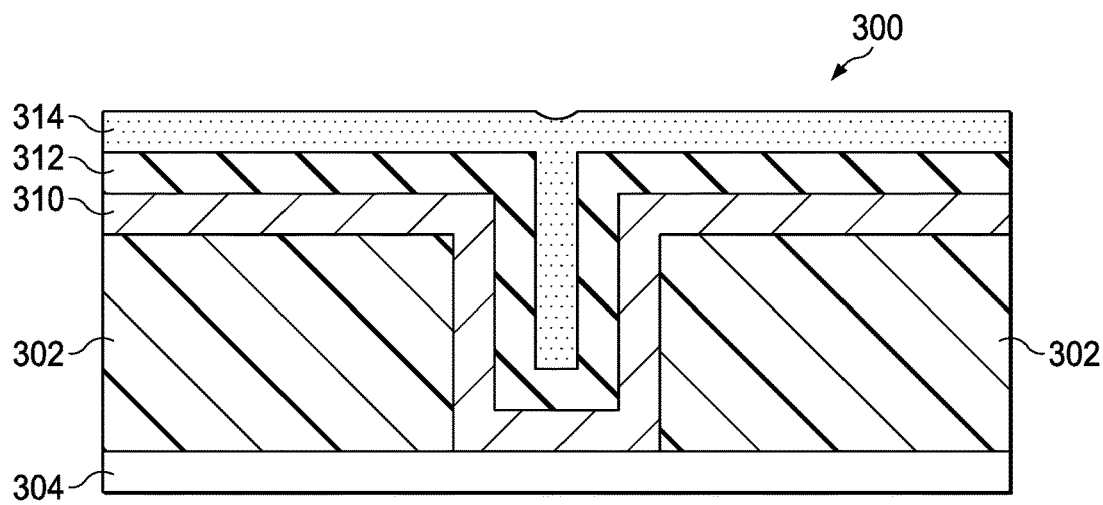

Step 208 is forming first protective layer 314. FIG. 3D shows first protective layer 314. First protective layer 314 is a layer used for masking subsequent etching of structural integrity layer 312. As used herein, a "protective layer" is used to protect some element from a processing step such as etching. In this example, first protective layer 314 is a polymer, such as a bottom anti-reflective coating (BARC) that is spun on. First protective layer 314 fills the remainder of opening 308 and is formed to a thickness of about 200 to 900 Å.

Figure 3E:
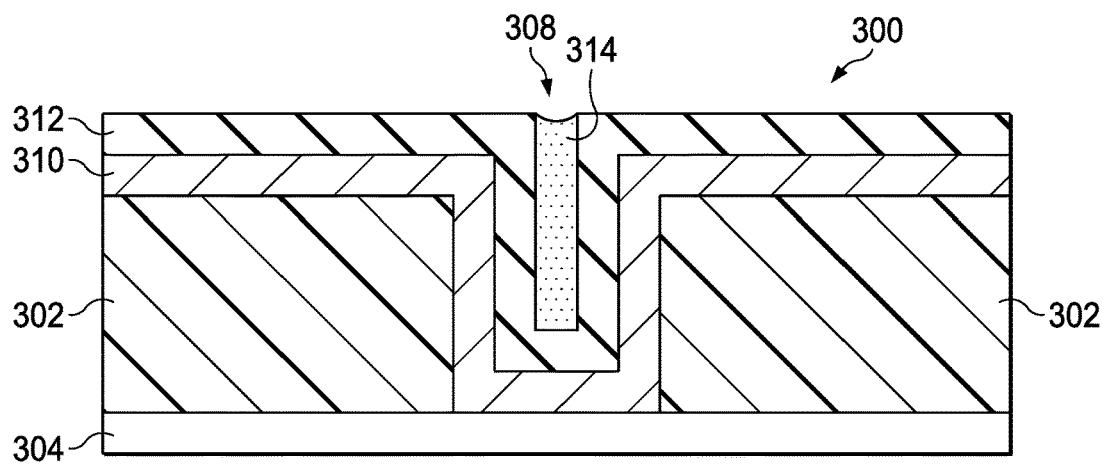

Step 210 is partial etching of first protective layer 314. FIG. 3E shows first protective layer 314 removed from the surfaces of structural integrity layer 312 outside of opening 308 and partially etched back into opening 308. As an example, plasma etching etches first protective layer 314 in step 210.

Figure 3F:
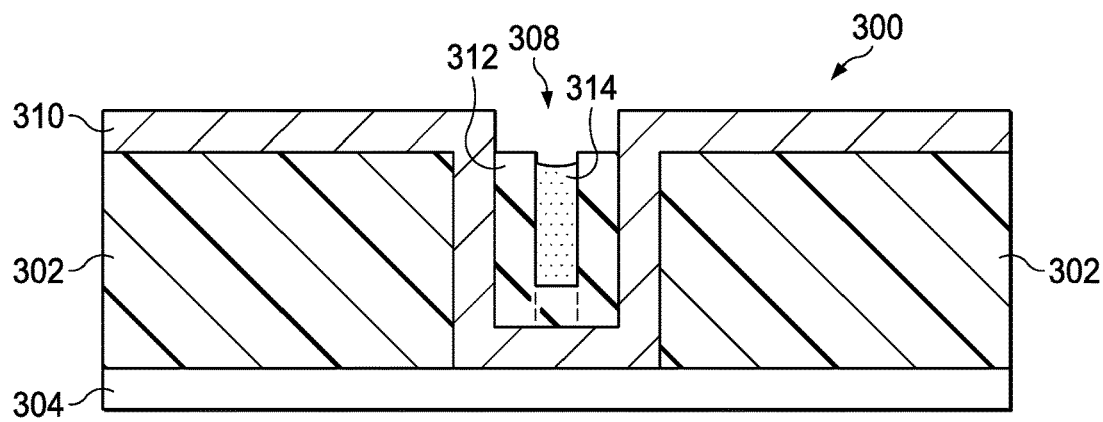

Step 212 is partial etching of structural integrity layer 312 using first protective layer 314 as a mask and leaving structural integrity layer 312 on bottom and sides of the opening 308. Structural integrity layer 312 is partially etched using first protective layer 314 as a mask and leaving structural integrity layer on the bottom and sides of opening 308. FIG. 3F shows the remaining portions of structural integrity layer 312 and first protective layer 314 after etching using an etchant that is selective to the material of structural integrity layer 312. For example, plasma etching with a fluorine containing etchant etches structural integrity layer 312. FIG. 3F shows that a portion of first protective layer 314 will be etched. The remaining portion of structural integrity layer 312 is on the bottom and sides of opening 308. In another example, first protective layer 314 is not used. The anisotropic etching will then leave structural integrity layer 312 on the sides of conductive layer 310 in opening 308, but not on the bottom, as indicated by the dashed lines.

Figure 3G:
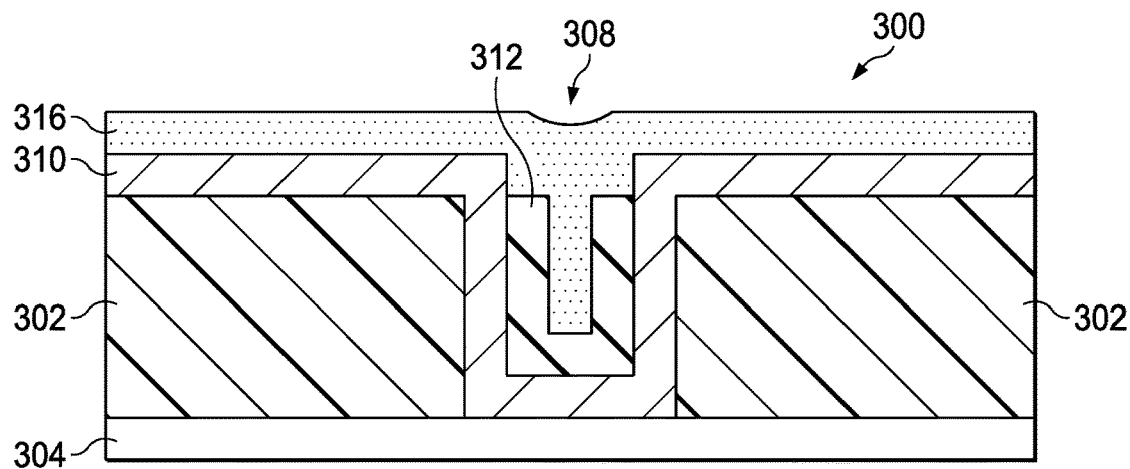

Step 214 is forming second protective layer 316. FIG. 3G shows second protective layer 316. Second protective layer 316 is a layer used for masking subsequent etching of conductive layer 310. In this example, ashing removes the remainder of first protective layer 314 before depositing second protective layer 316. First protective layer 314 may be removed or may remain to merge with second protective layer 316. In this example, second protective layer 316 is a polymer, such as a bottom anti-reflective coating (BARC) that is spun on. Second protective layer 316 fills the remainder of opening 308 and is formed to a thickness of about 200 to 900 Å.

Figure 3H:
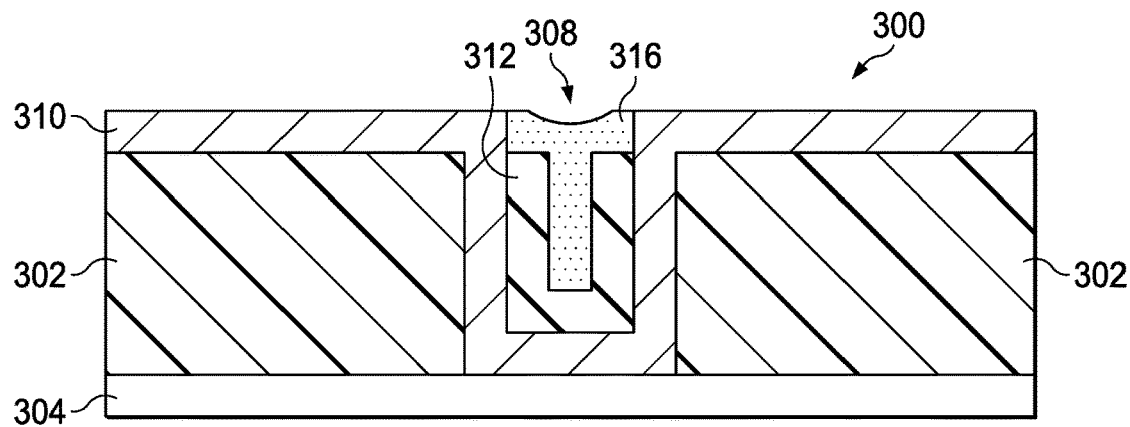

Step 216 is partial etching of second protective layer 316. FIG. 3H shows second protective layer 316 removed from the surfaces of conductive layer 310 outside of opening 308 and partially etched back into opening 308. As an example, plasma etching etches second protective layer 316 in step 216.

Figure 3I:
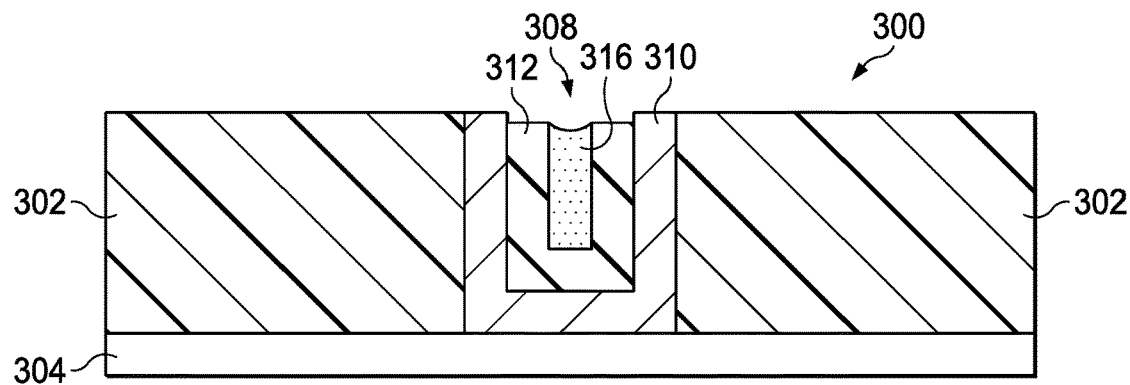

Step 218 is partial etching of conductive layer 310 using second protective layer 316 as a mask and leaving conductive layer 310 on bottom and sides of opening 308. FIG. 3I shows the remaining portions of conductive layer 310, structural integrity layer 312 and second protective layer 316 after etching using an etchant that is selective to the material of conductive layer 310. For example, plasma etching with a fluorine or chlorine containing etchant etches conductive layer 310. FIG. 3I shows that step 218 etches a portion of second protective layer 316 and structural integrity layer 312. The remaining portion of conductive layer 310 is within opening 308.

Figure 3J:
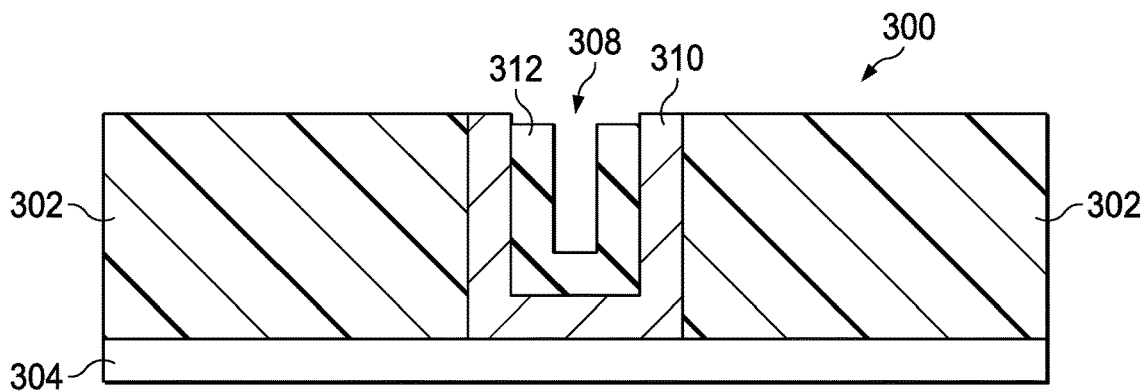

Step 220 is removing the remaining portion of second protective layer 316. FIG. 3J shows the remaining structure after the portion of second protective layer 316 remaining after step 218 has been removed by, for example, plasma ashing.

Figure 3K:
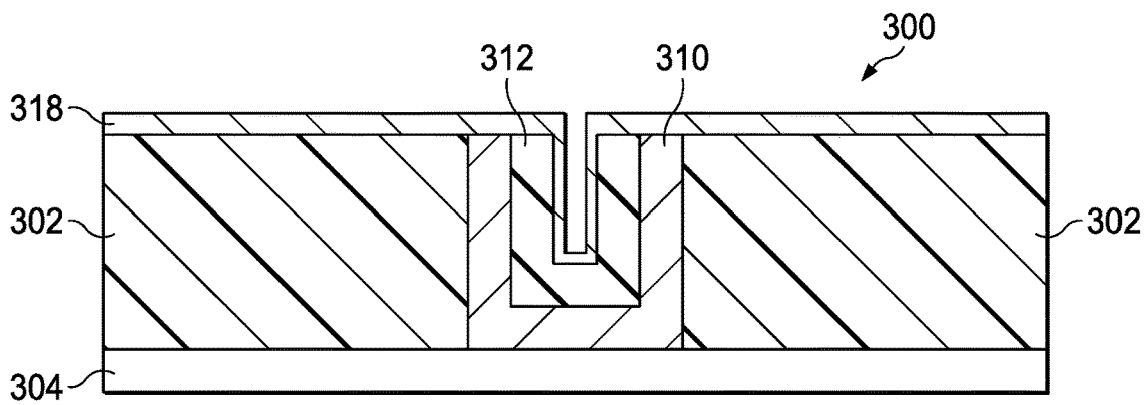

Step 222 is forming a mirror 320. FIG. 3K shows mirror layer 318 formed on the surface of conductive layer 310, structural integrity layer 312 and sacrificial layer 302. In an example, mirror layer 318 is an aluminum alloy that is deposited by physical vapor deposition to a thickness of 1,500 to 2,500 Å. In other examples, mirror layer 318 is another material that provides good conductivity and good reflectivity. Also, as an example, sacrificial layer 302 is subjected to cleaning processes before deposition. Because the surface area of mirror layer 318 on sacrificial layer 302 is deposited in one deposition, and not on a remaining conductive layer, the present method allows for tailoring the deposition process to provide the desired characteristics for the entire mirror layer on the surface of sacrificial layer 302. Mirror layer 318 is then patterned and etched to form an individual mirror.

Figure 3L:
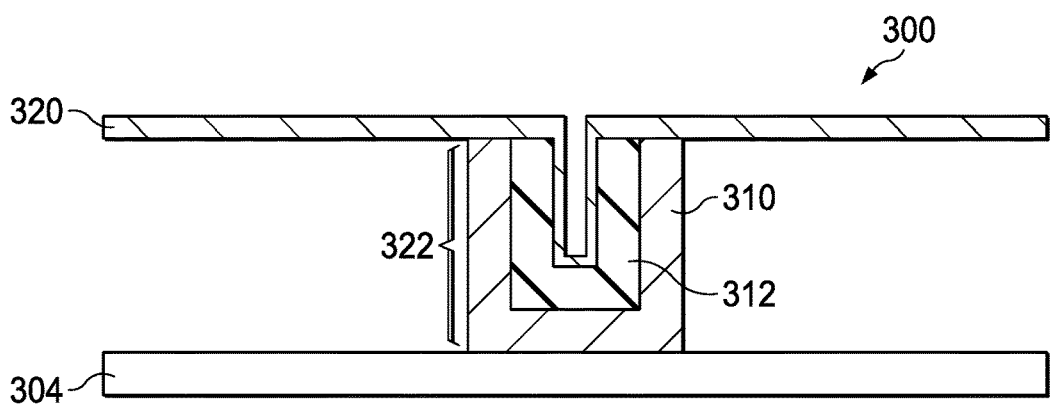

Step 224 is removing the sacrificial layer. FIG. 3L shows that sacrificial layer 302 is removed by selective isotropic etching. The remaining structure includes mirror 320, which is patterned from mirror layer 318, structural integrity layer 312 and conductive layer 310. Conductive layer 310 provides conduction from substrate 304 to mirror 320. Structural integrity layer 312 provides a structural integrity to via 322.

Figure 4:
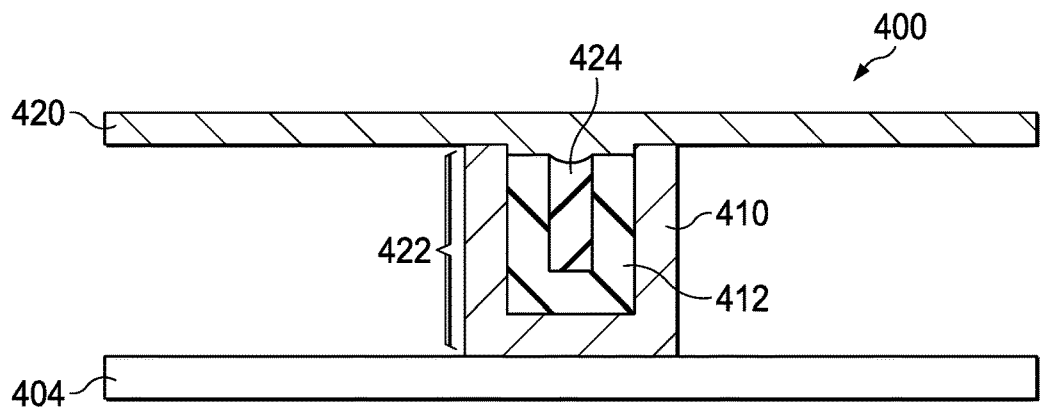
FIG. 4 is a diagram of another example MEMS device.

FIG. 4 shows another example MEMS device 400. Examples of MEMS devices include sensors (e.g., temperature, pressure, gas, moisture, and motion sensors), accelerometers, valves, motors, actuators, and micromirrors. In this example, MEMS device 400 is a micromirror. In this example, MEMS device 400 is part of an integrated circuit. In other examples, MEMS device 400 is not part of an integrated circuit or is part of a hybrid circuit package. Via 422 (or post 422) is between substrate 404 and a MEMS element, such as mirror 420. Via 422 includes conductive layer 410, structural integrity layer 412, and fill layer 424. In this example, substrate 404 is a hinge. The other portions of the hinge are not shown for simplicity of explanation. In other examples, substrate 404 is a semiconductor substrate or another material. As used herein, a "fill layer" is a layer of material to fill an opening. In another example, structural integrity layer 412 fills the portion of via 422 not occupied by conductive layer 410, and thus fill layer 424 is not necessary. An example process for fabricating MEMS device 400 is described hereinbelow.

Figure 5:
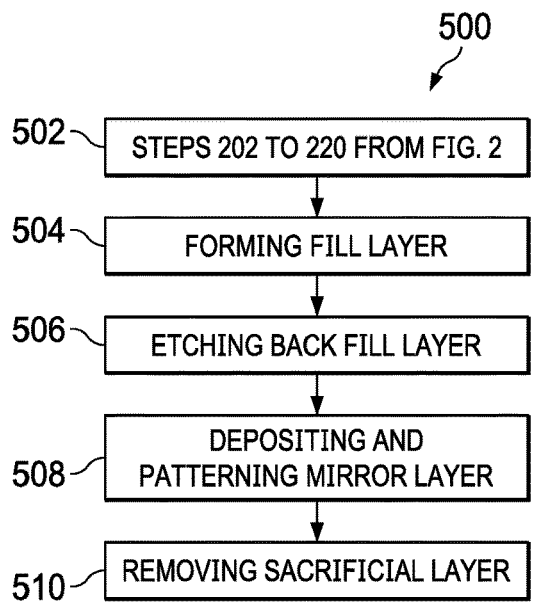
FIG. 5 is a flow diagram for an example process for forming the example MEMS device of FIG. 4.
Figure 6A:
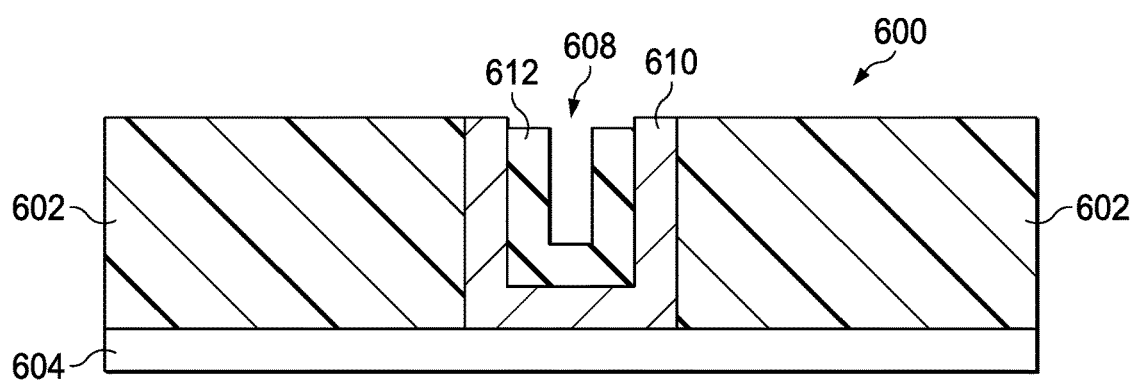
FIGS. 6A through 6E (collectively "FIG. 6") are diagrams illustrating the steps of the example process of FIG. 5 for forming the example MEMS device of FIG. 4.
Figure 6B:
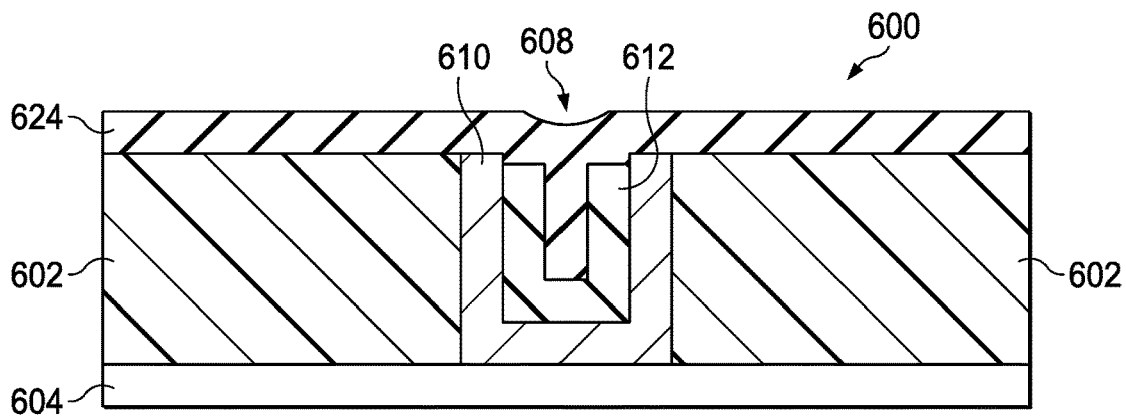
Figure 6C:
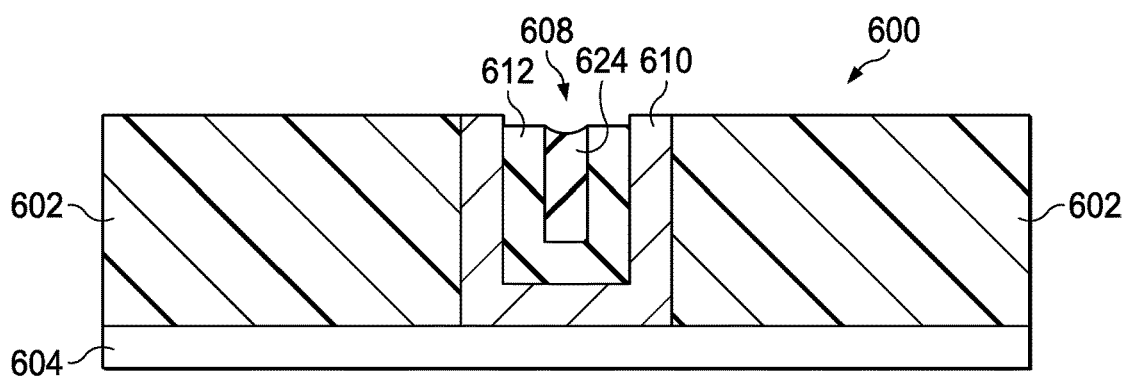

FIG. 5 is a flow diagram for an example process 500. FIGS. 6A through 6E (collectively "FIG. 6") illustrate the steps of process 500. FIG. 6 shows the steps in forming MEMS device 600, which is like MEMS device 400 (FIG. 4). Step 502 is steps 202 through 220 of process 200 (FIG. 2), which produces the structure of FIG. 6A, which is like the structure illustrated in FIG. 3J. Sacrificial layer 602 is like sacrificial layer 302 (FIG. 3J). Substrate 604 is like substrate 304 (FIG. 3J). Opening 608 is like opening 308 (FIG. 3J). Conductive layer 610 is like conductive layer 310 (FIG. 3J). Structural integrity layer 612 is like structural integrity layer 312 (FIG. 3J). Step 504 is forming fill layer 624. Fill layer 624 is formed as shown in FIG. 6B. Fill layer 624 is one of, or a combination of, materials such as silicon dioxide, silicon nitride, titanium nitride, titanium, titanium-tungsten (TiW), photoresist, polyimide, germanium, germanium oxide, polycrystalline silicon, phosphor-silicate-glass (PSG), borophosphosilicate glass (BPSG) and spin-on-glass (SOG). The process for forming fill layer 624 is dependent upon the material used. Step 506 is etching back fill layer 624. Fill layer 624 is etched using reactive ion etching (RIE) or plasma etching to remove fill layer 624 except in opening 608 as shown in FIG. 6C. In another example, structural integrity layer 612 is deposited to a thickness that fills the remainder of via 622, and thus fill layer 624 is not necessary.

Figure 6D:
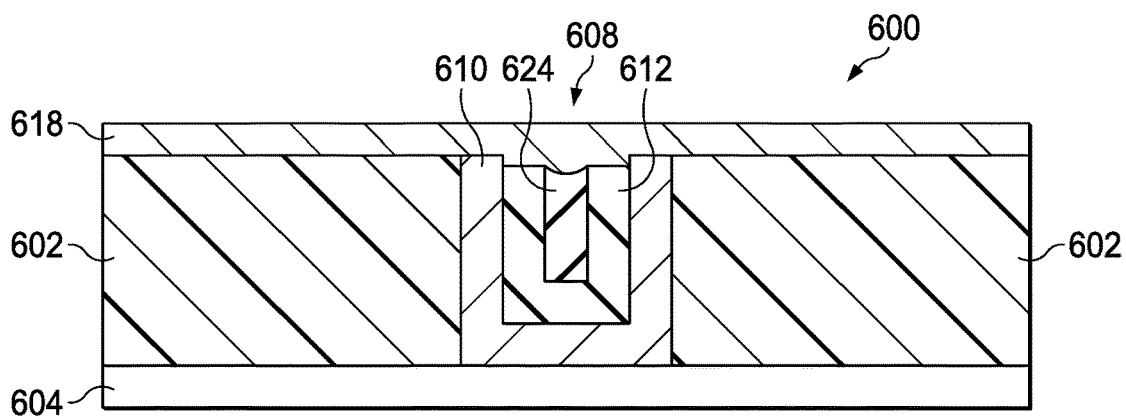

Step 508 is depositing mirror layer 618. Mirror layer 618 is deposited using CVD or physical deposition on conductive layer 610, structural integrity layer 612, fill layer 624 and sacrificial layer 602 as shown in FIG. 6D. In an example, mirror layer 618 is an aluminum alloy that is deposited by physical vapor deposition to a thickness of between 1,500 and 2,500 Å. In other examples, mirror layer 618 is another material that provides good conductivity and good reflectivity. In an example, sacrificial layer 602 is subjected to a cleaning processes before deposition. Because the surface area of mirror layer 618 on sacrificial layer 602 is deposited in one deposition, the present method allows for a high-quality mirror layer 618. Mirror layer 618 is then patterned and etched to form an individual mirror.

Figure 6E:
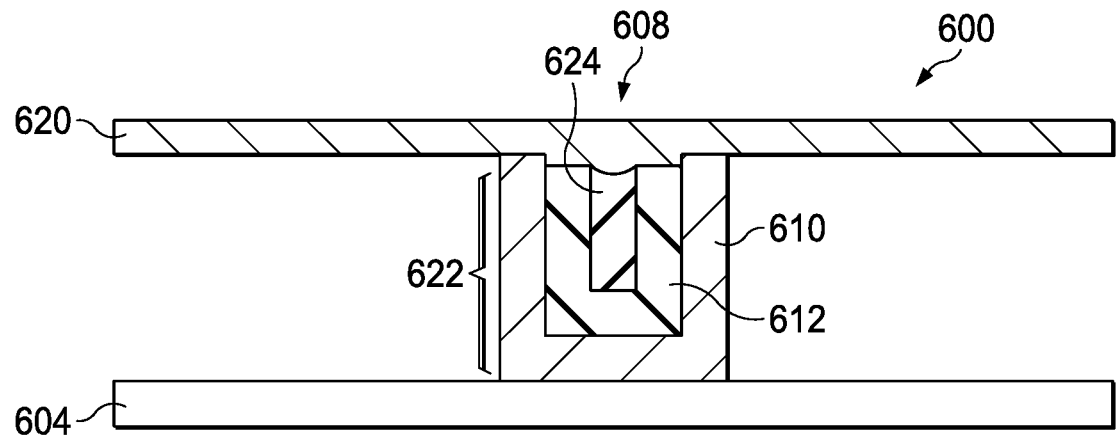

Step 510 is removing sacrificial layer 602. Selective isotropic etching removes sacrificial layer 602 as shown in FIG. 6E. The remaining structure includes mirror 620, which is patterned from mirror layer 618, structural integrity layer 612 and conductive layer 610. Conductive layer 610 provides conduction from substrate 604 to mirror 620. Structural integrity layer 612 provides a structural integrity to via 622. With the structure of FIG. 6E, mirror 620 is flat across the top of via 622, and thus provides improved light throughput because the area above via 622 contributes to light reflection.

Figure 7:
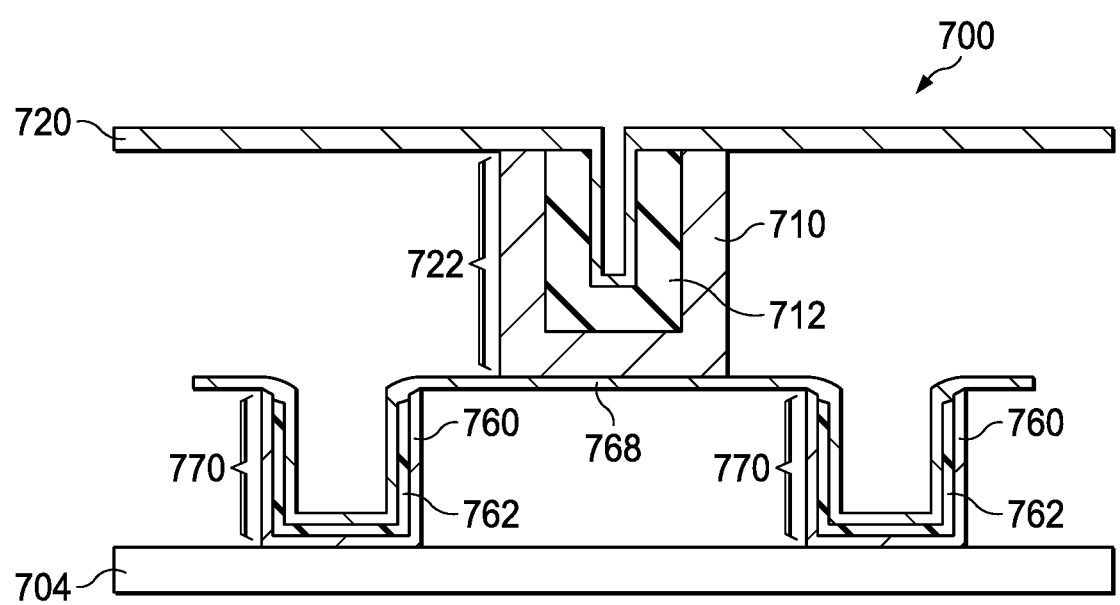
FIG. 7 is a diagram of another example MEMS device.

FIG. 7 shows another example MEMS device 700. Examples of MEMS devices include sensors (e.g., temperature, pressure, gas, moisture, and motion sensors), accelerometers, valves, motors, actuators, and micromirrors. In this example, MEMS device 700 is a micromirror. In this example, MEMS device 700 is part of an integrated circuit. In other examples, MEMS device 700 is not part of an integrated circuit or is part of a hybrid circuit package. Posts or vias 770 are over substrate 704. Vias 770 include conductive layers 760 and structural integrity layers 762. Vias 770 support torsion bar 768. Via 722 is over torsion bar 768, thus torsion bar 768 serves as a substrate for via 722. Via 722 includes conductive layer 710 and structural integrity layer 712. Via 722 supports mirror 720. Structural integrity layer 712 provides a structural integrity to via 722. Torsion bar 768 allows for movement of mirror 720 with less stress on via 722. Conductive layer 760 provides conduction from torsion bar 768 to one or more contacts (not shown) in substrate 704. Conductive layer 710 provides conductivity from torsion bar 768 to mirror 720. Structural integrity layers 762 provide additional strength to vias 770.

Figures 8A, 8B:
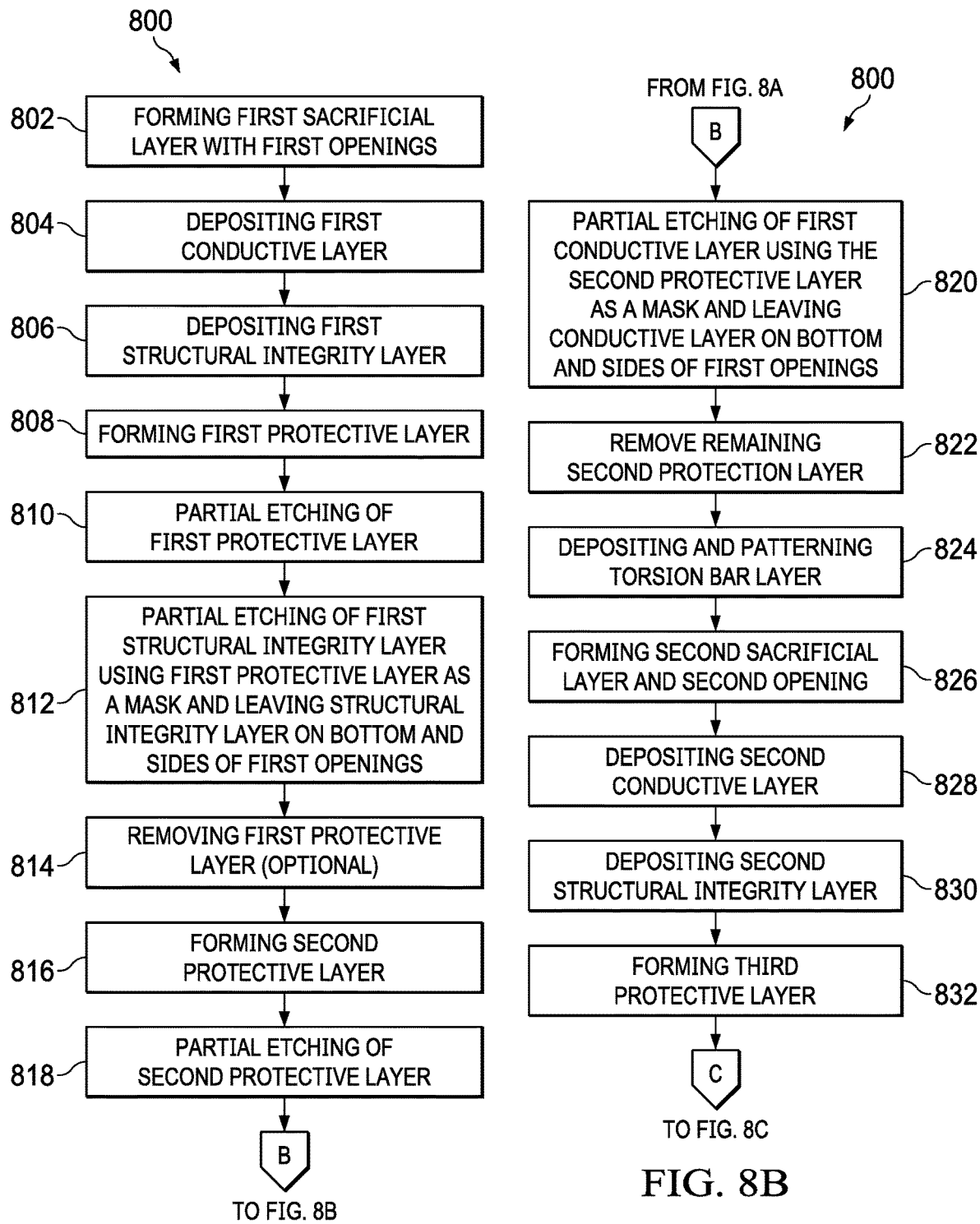
FIGS. 8A through 8C (collectively "FIG. 8") is a flow diagram of an example process for forming the example MEMS device of FIG. 7.
Figure 8C:
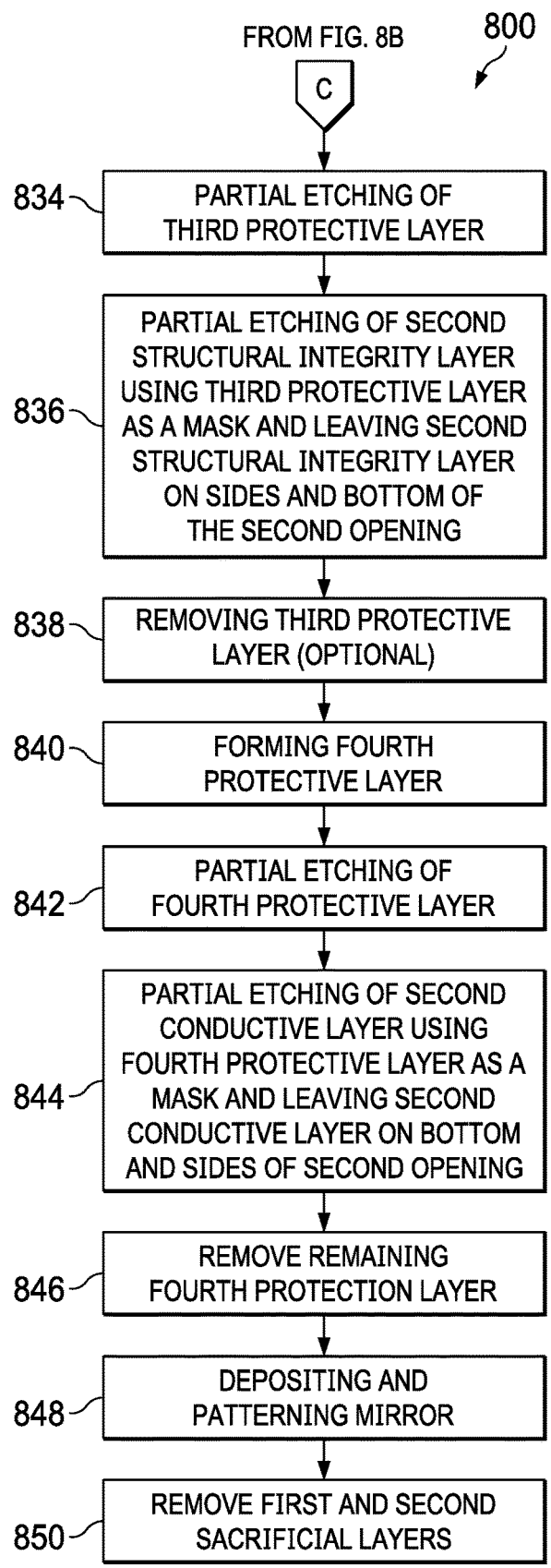
Figure 9A:
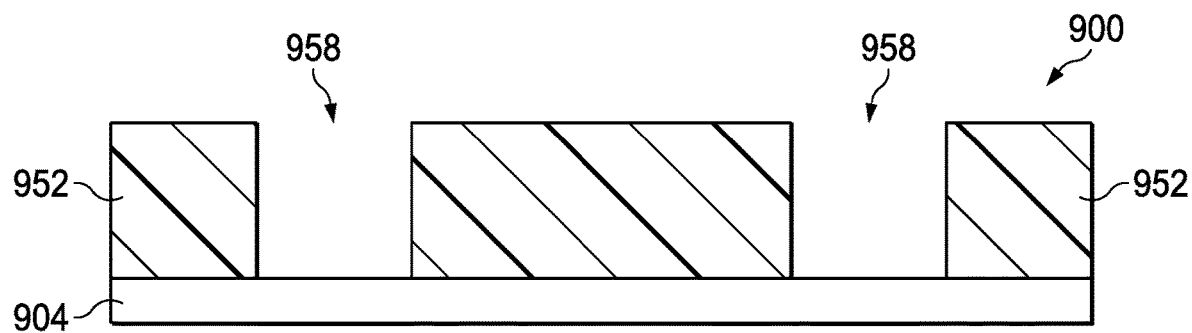
FIGS. 9A through 9R (collectively "FIG. 9") are diagrams illustrating the steps of the example process of FIG. 8 for forming the example MEMS device of FIG. 7.
Figure 9B:
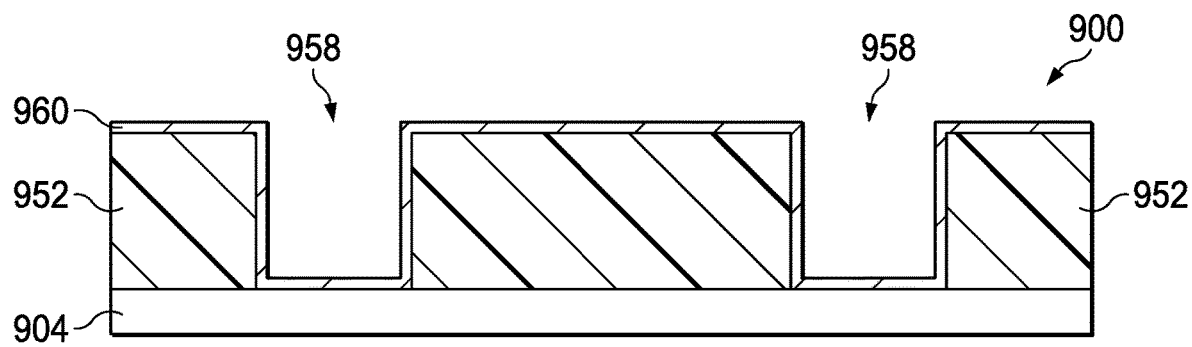
Figure 9C:
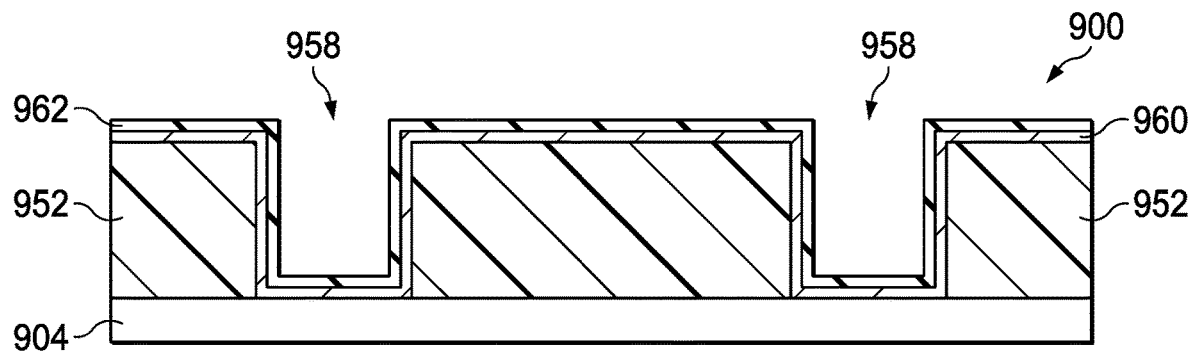
Figure 9D:
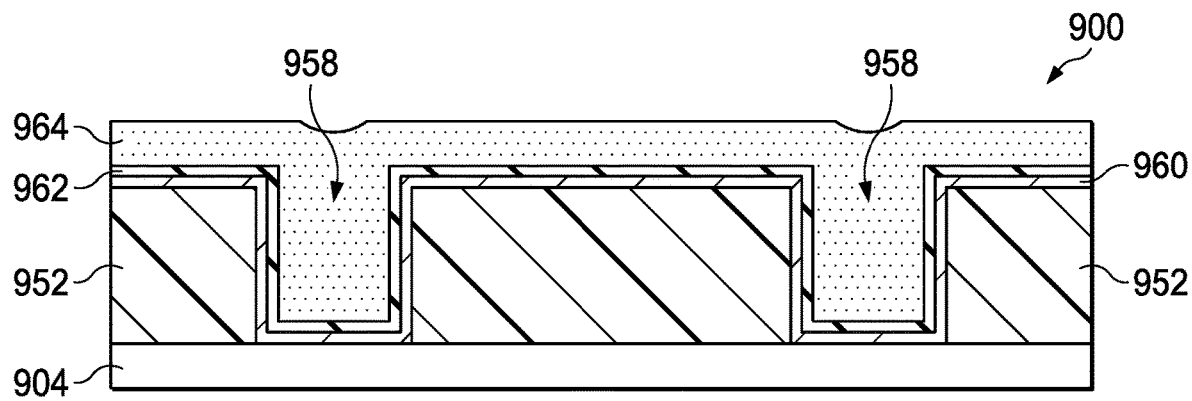
Figure 9E:
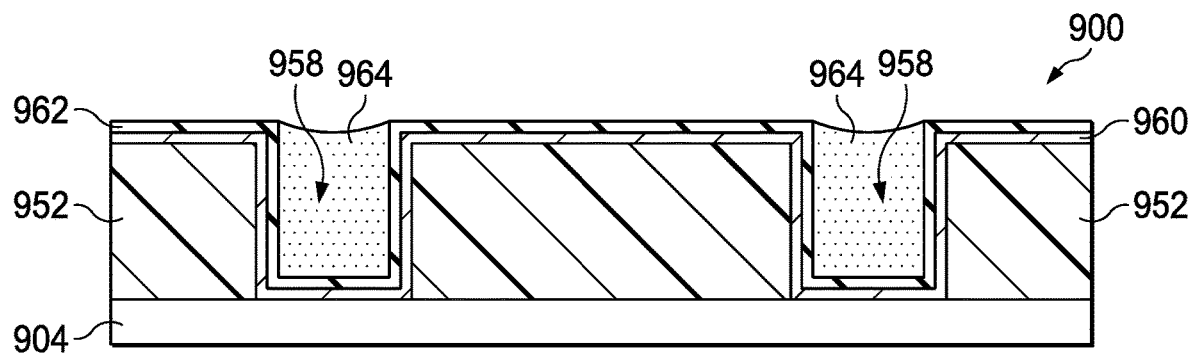
Figure 9F:
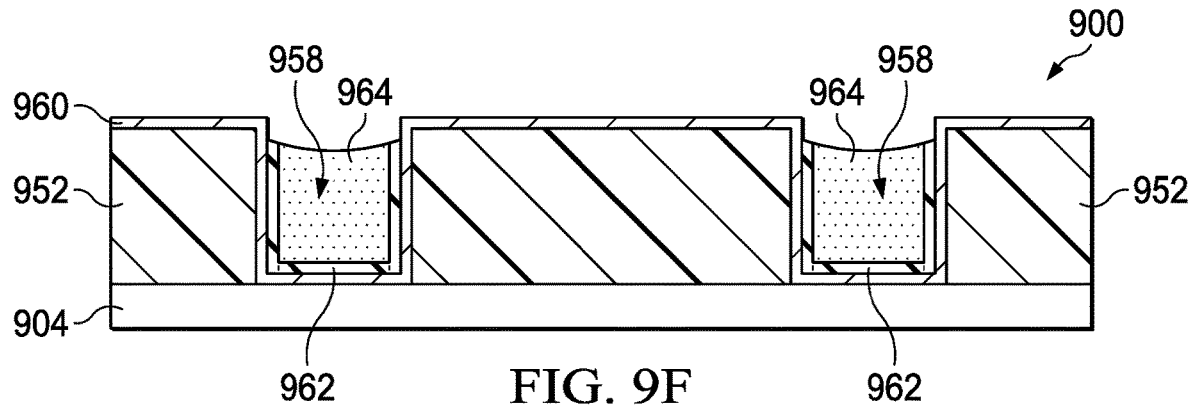
Figure 9G:
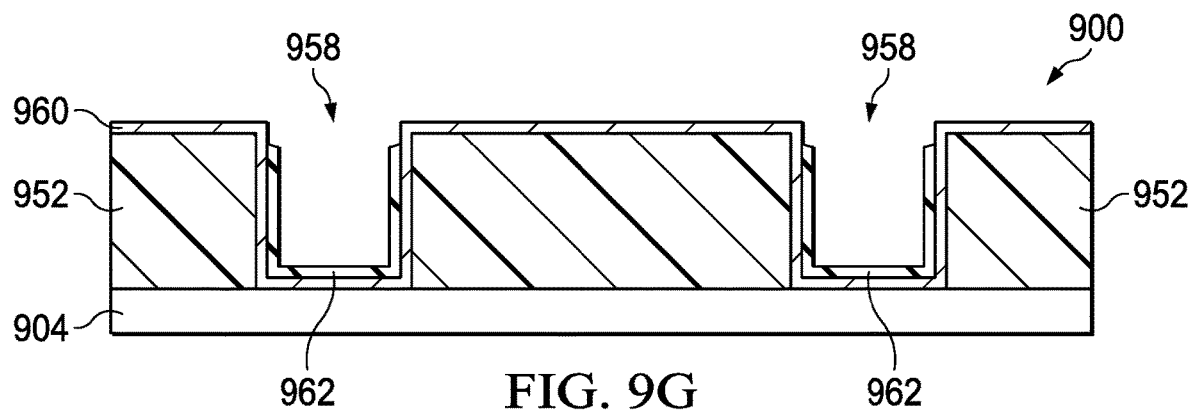
Figure 9H:
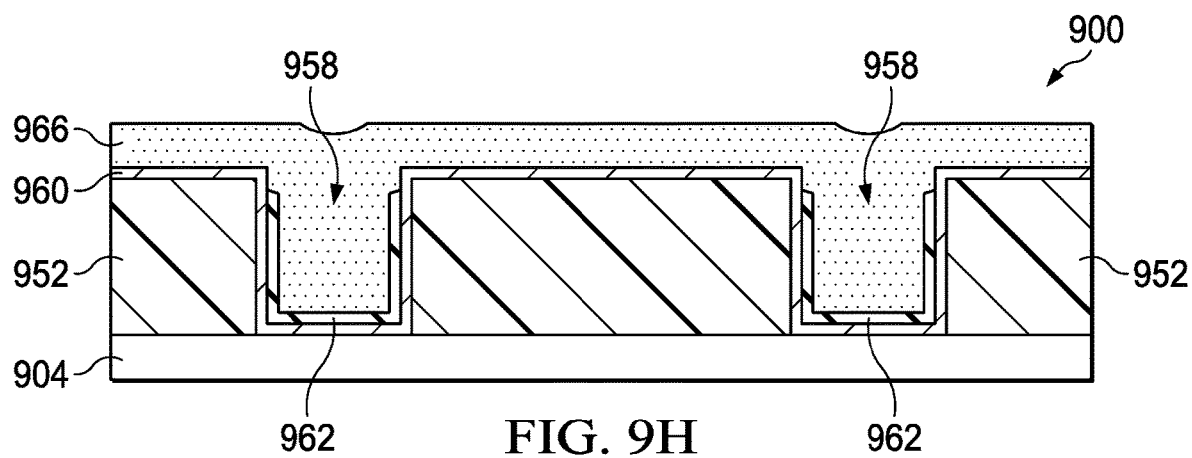
Figure 9I:
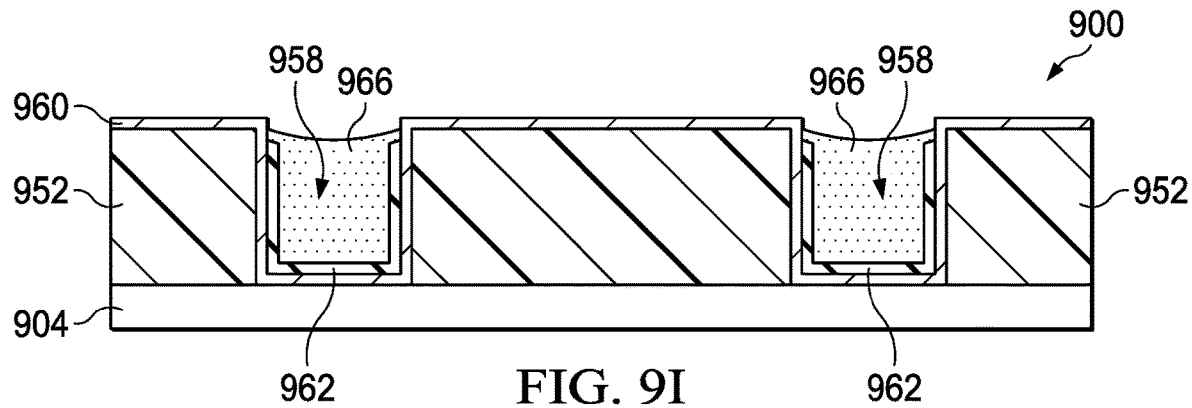
Figure 9J:
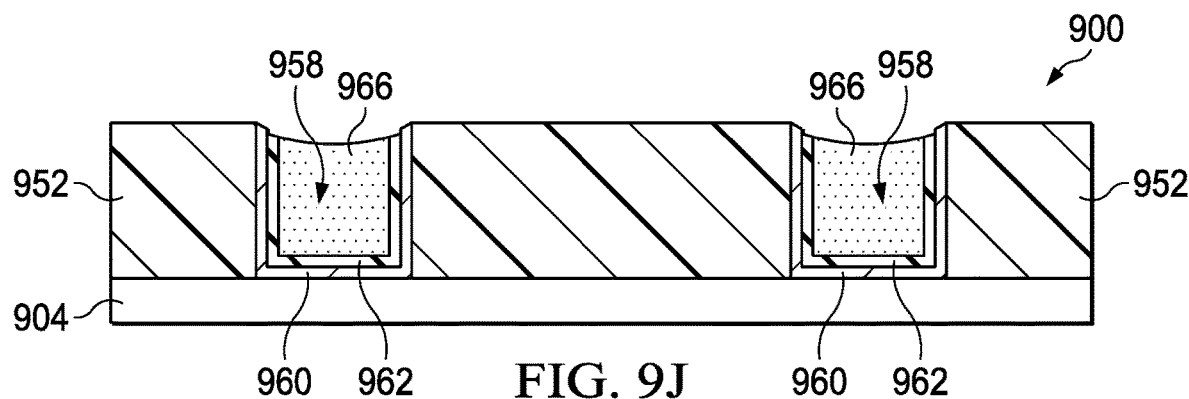
Figure 9K:
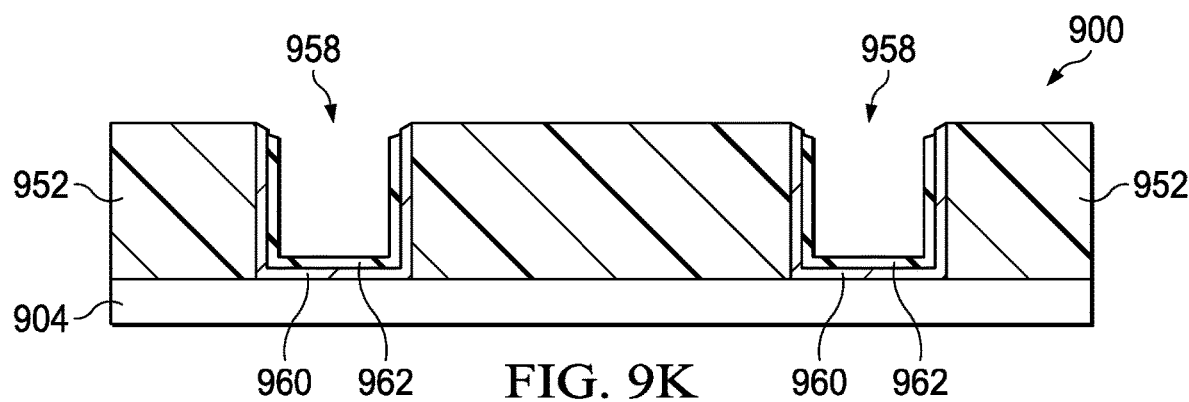
Figure 9L:
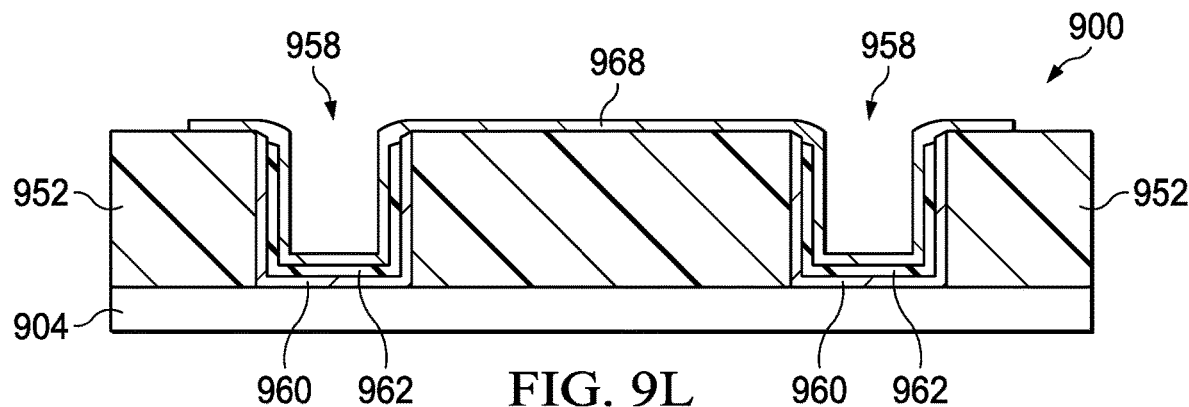
Figure 9M:
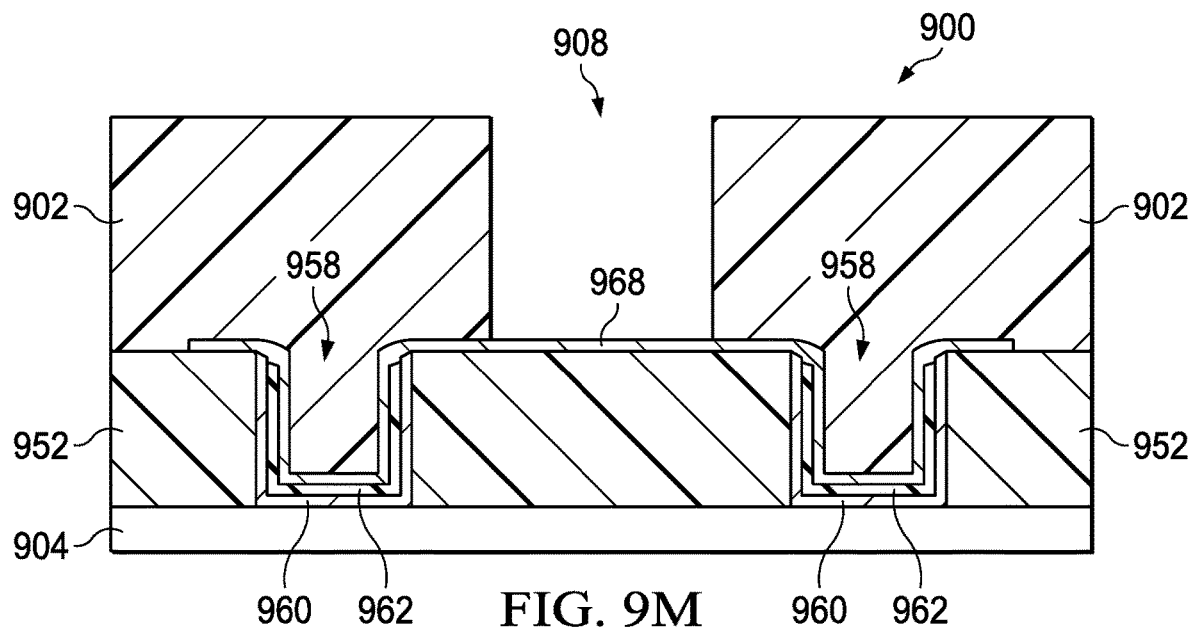
Figure 9N:
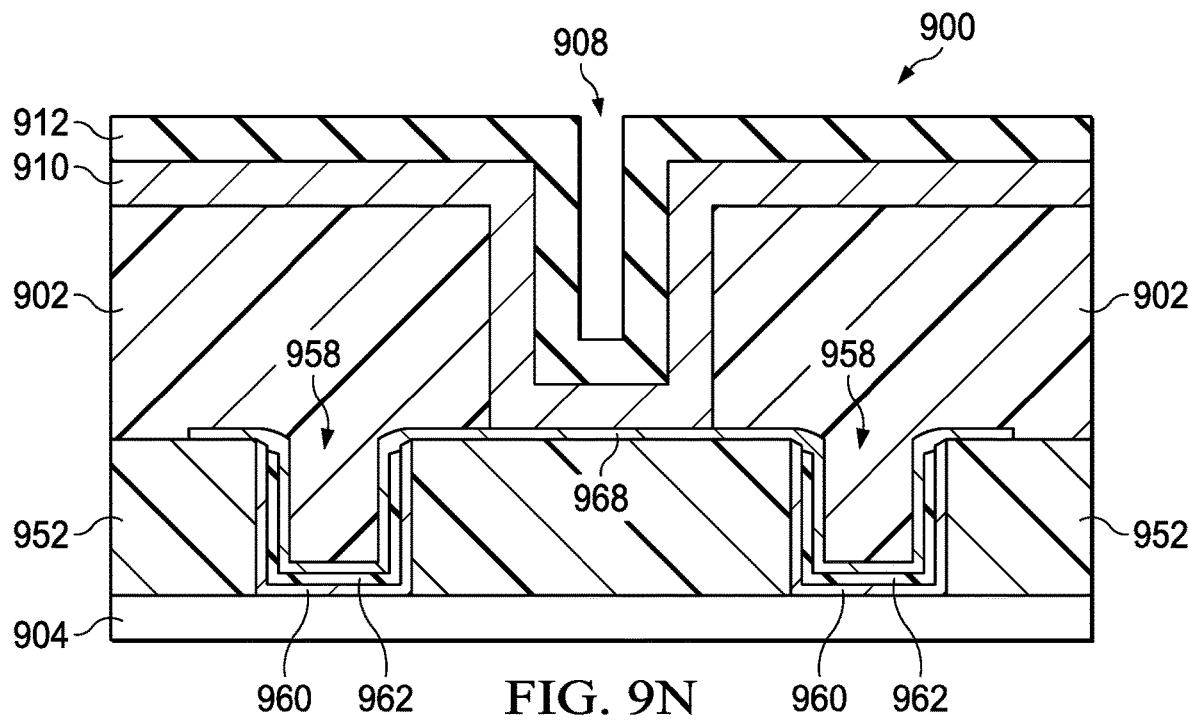
Figure 9O:
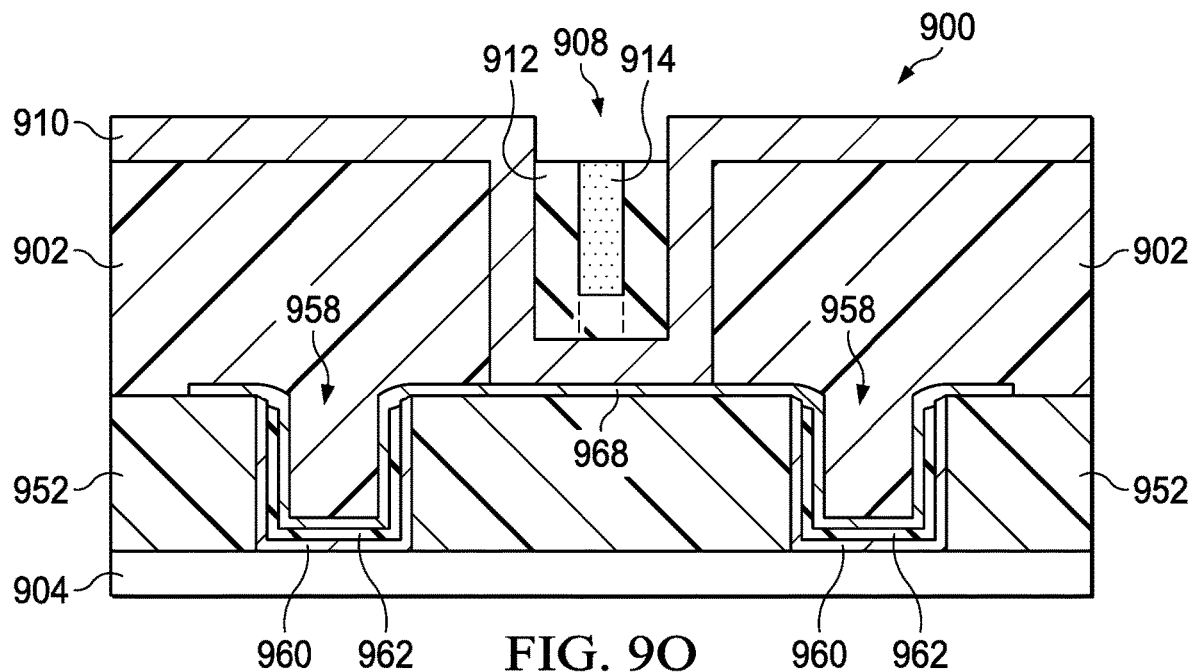
Figure 9P:
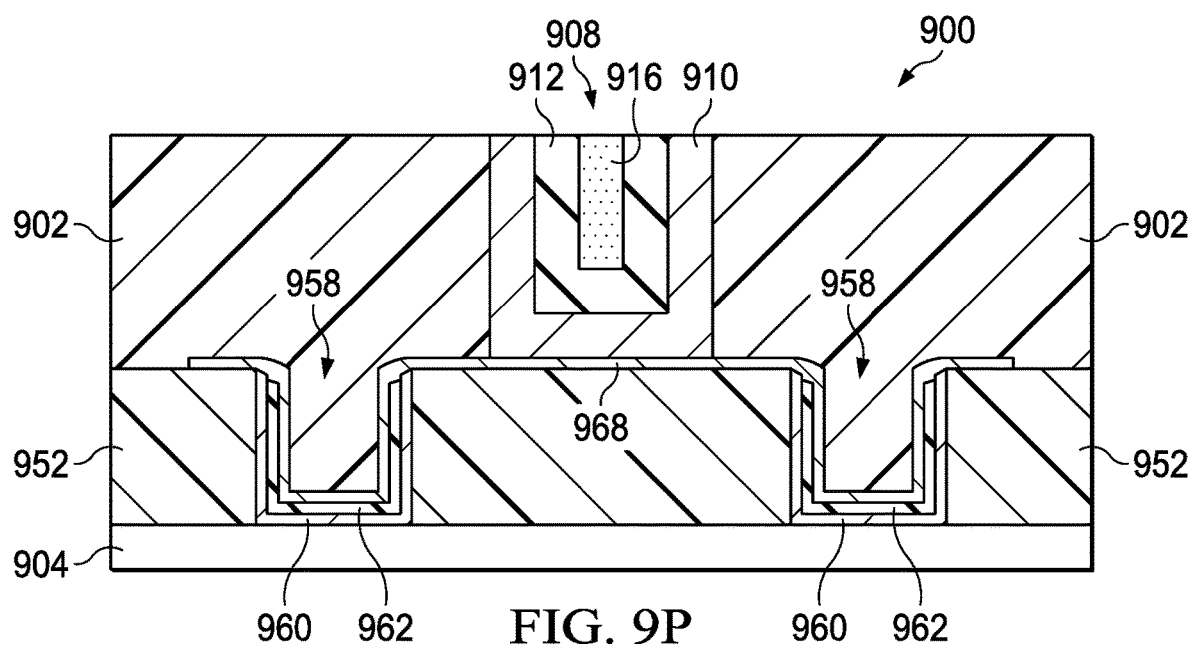
Figure 9Q:
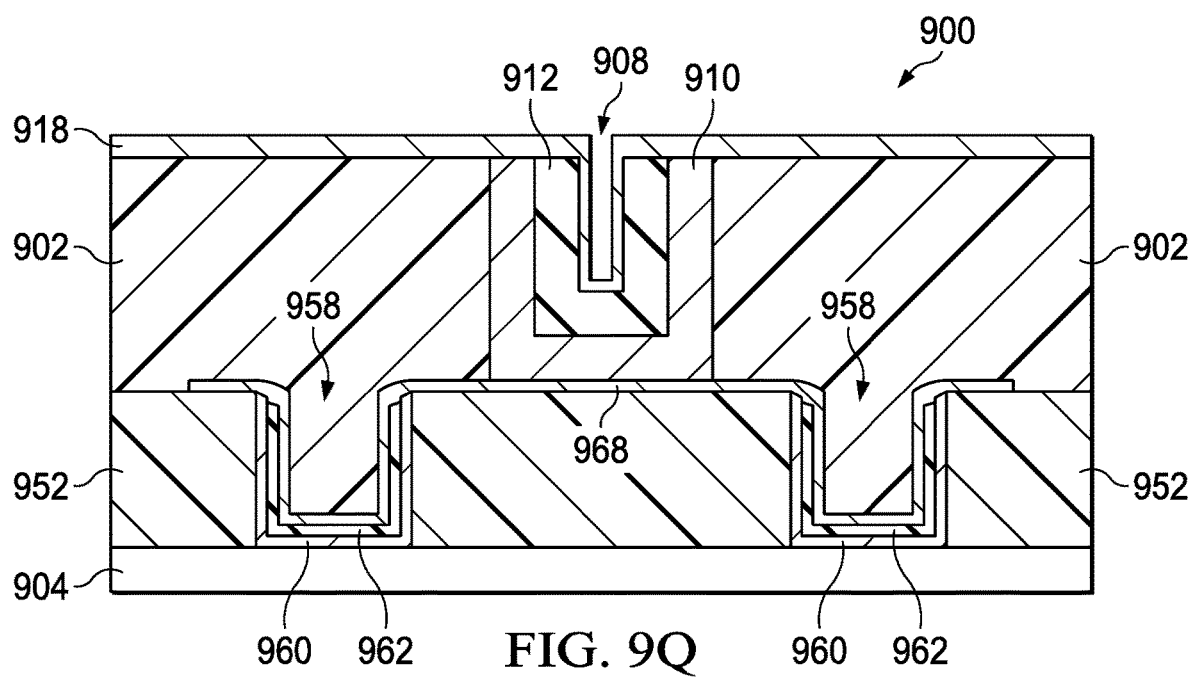
Figure 9R:
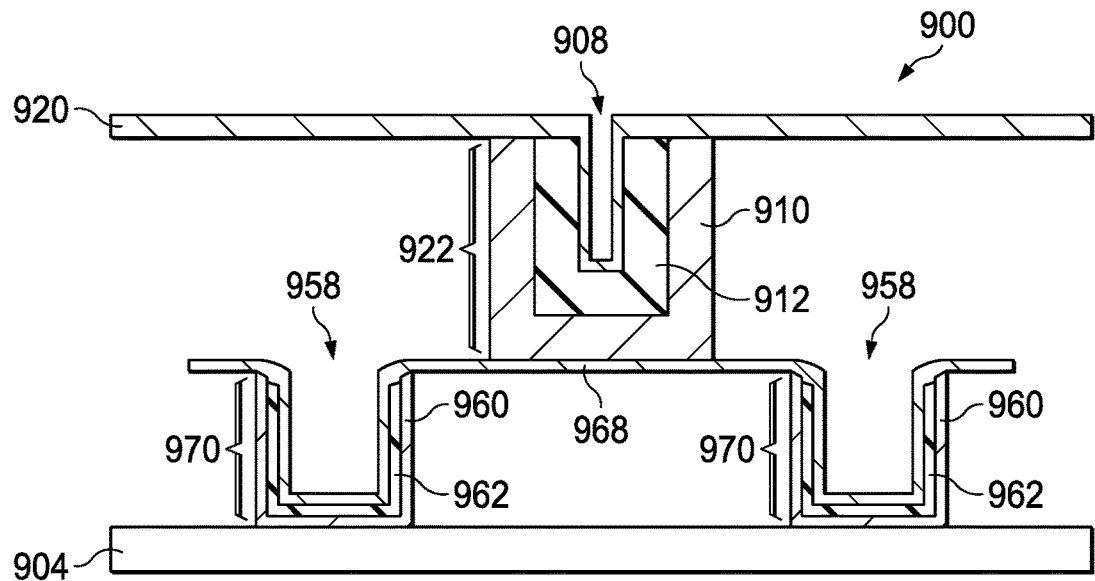

FIGS. 8A through 8C (collectively "FIG. 8") is a flow diagram of an example process 800, the steps of which are illustrated in FIGS. 9A through 9R (collectively "FIG. 9"). FIG. 9 shows the steps in forming micromirror 900, which is like MEMS device 700 (FIG. 7). Step 802 is forming first sacrificial layer 952 with first openings 958. Reactive ion etching (RIE) or plasma etching forms first openings 958 in first sacrificial layer 952 as shown in FIG. 9A. First sacrificial layer 952 is, in this example, a silicon dioxide layer. Examples of materials for first sacrificial layer 952 include silicon dioxide, silicon nitride, photoresist, polyimide, germanium, germanium oxide, polycrystalline silicon, phosphor-silicate-glass (PSG), borophosphosilicate glass (BPSG) and spin-on-glass (SOG). First openings 958 are formed in first sacrificial layer 952 using a photolithographic mask and etching.

Step 804 is depositing first conductive layer 960. In an example, CVD or physical vapor deposition (PVD) forms first conductive layer 960 as shown in FIG. 9B. In this example, first conductive layer 960 is titanium-aluminum (TiAl). In other examples, conductive layer is other conductive materials such as titanium nitride (TiN) or aluminum. Step 806 is depositing first structural integrity layer 962. CVD deposits first structural integrity layer 962 as shown in FIG. 9C. In this example, first structural integrity layer 962 is silicon dioxide, silicon nitride or another suitable material.

Step 808 is forming first protective layer 964. First protective layer 964 is formed as shown in FIG. 9D. In this example, first protective layer 964 is BARC that is spun on. Step 810 is partial etching of first protective layer 964. Using RIE or plasma etching, first protective layer 964 is etched back as shown in FIG. 9E. Step 812 is partial etching of first structural integrity layer 962 using first protective layer 964 as a mask and leaving the first structural integrity layer 962 on bottom and sides of first openings 958. RIE or plasma etching etches first structural integrity layer 962. As shown in FIG. 9F, first protective layer 964 protects the portion of first structural integrity layer 962 on the sides and bottoms of first openings 958. As also shown in FIG. 9F, first protective layer 964 is further etched in this process. In another example, first protective layer 964 is not used. The anisotropic etching will then leave first structural integrity layer 962 on the sides of first conductive layer 960 in first openings 958, but not on the bottom as shown by the dashed lines in FIG. 9F.

Step 814 is optionally removing first protective layer 964. Ashing removes first protective layer 964 as shown in FIG. 9G. Step 816 is forming second protective layer 966. In this example, second protective layer 966 is BARC that is spun on. Step 818 is partial etching of second protective layer 966. Using RIE or plasma etching, second protective layer 966 is etched back as shown in FIG. 9I. Step 820 is partial etching of first conductive layer 960 using second protective layer 966 as a mask and leaving first conductive layer 960 on bottoms and sides of the first openings. RIE or plasma etching using fluorine or chlorine etches first conductive layer 960. As shown in FIG. 9J, second protective layer 966 protects the portion of first conductive layer 960 on the sides and bottoms of first openings 958. As also shown in FIG. 9J, second protective layer 966 is further etched in this process. Step 822 is removing the remaining second protective layer 966. Second protective layer 966 is removed by ashing as shown in FIG. 9K.

Step 824 is depositing and patterning torsion bar layer 968. CVD or physical vapor deposition forms torsion bar layer 968, which is then patterned using a photolithographic mask to selectively remove portions of torsion bar layer 968. The resulting patterned torsion bar layer 968 is shown in FIG. 9L.

Step 826 is forming a second sacrificial layer 902 and forming a second opening 908. FIG. 9M shows second sacrificial layer 902 formed over torsion bar layer 968, including filling the remainder of first openings 958. In this example, second sacrificial layer 902 is silicon dioxide formed to a thickness of about 5,000 Å. In this example, sacrificial layer is a silicon dioxide layer. Examples of materials for first sacrificial layer 902 include silicon dioxide, silicon nitride, photoresist, polyimide, germanium, germanium oxide, polycrystalline silicon, phosphor-silicate-glass (PSG), borophosphosilicate glass (BPSG) and spin-on-glass (SOG). Second sacrificial layer 902 is patterned using a photolithographic mask and etching. As further shown hereinbelow, the length of the via is determined by the thickness of second sacrificial layer 902. In this example, the via will have a length of about 5,000 Å; other via lengths may selected based on structural and other design considerations. In some examples, second opening 908 is circular as viewed from the top of the page with FIG. 9M and thus second opening 908 is cylindrical. In this example, second opening 908 exposes torsion bar layer 968.

Step 828 is depositing a second conductive layer 910. FIG. 9N shows second conductive layer 910 formed on the surface of second sacrificial layer 902, on the sides of second sacrificial layer 902 and on torsion bar layer 968 at the bottom of second opening 908. In an example, second conductive layer 910 is titanium-aluminum (TiAl) or titanium-nitride (TiN) formed using a chemical vapor deposition or physical deposition to a thickness 300 to 400 Å. As an example, the material of second conductive layer 910 is selected for good conductivity and for good coverage of vertical surfaces (e.g., the sides of second opening 908 in second sacrificial layer 902) and horizontal surfaces.

Step 830 is depositing a second structural integrity layer 912. FIG. 9N shows second structural integrity layer 912 formed over second conductive layer 910. In an example, second structural integrity layer 912 is formed using chemical vapor deposition of silicon dioxide, silicon nitride or another suitable material to a thickness of about 3,000 Å. Step 832 is forming a third protective layer 914 and step 834 is partial etching of the third protective layer 914. Third protective layer 914 is a polymer such as BARC that is spun on, in this example, and is etched using RIE or plasma etching, which results in third protective layer 914 as shown in FIG. 9O. Step 836 is partial etching of second structural integrity layer 912 using third protective layer 914 as a mask and leaving second structural integrity layer 912 on sides and bottom of the second opening. Second structural integrity layer 912 is etched by, for example, RIE to partially second structural integrity layer 912 using third protective layer 914 as a mask. This partial etching leaves second structural integrity layer 912 on the sides and the bottom of second opening 908. The result of step 836 is second structural integrity layer 912 as shown in FIG. 9O. In another example, third protective layer 914 is not used. The anisotropic etching will then leave second structural integrity layer 912 on the sides of second conductive layer 910 in second opening 908, but not on the bottom as shown by the dashed lines in FIG. 9O. Step 838 is optionally removing the third protective layer 914. Third protective layer 914 is removed using ashing.

Step 840 is forming a fourth protective layer 916. Step 842 is partially etching fourth protective layer 916. Fourth protective layer 916 is a polymer such as BARC that is spun on, in this example, and is etched using RIE or plasma etching, which results in fourth protective layer 916 as shown in FIG. 9P. In another example, third protective layer 914 is not removed before depositing fourth protective layer 916 and the remainder of third protective layer 914 merges with fourth protective layer 916. Step 844 is partial etching of second conductive layer 910 using fourth protective layer 916 as a mask and leaving second conductive layer 910 on bottom and sides of second opening. Second conductive layer 910 is etched by RIE or plasma etching using fourth protective layer 916 and second structural integrity layer 912 as a mask. The resulting second conductive layer 910 is shown in FIG. 9P. Step 846 is removing the remaining fourth protective layer 916. Fourth protective layer 916 is removed using ashing.

Step 848 is depositing and patterning mirror layer 918. Mirror layer 918 forms on second conductive layer 910, second structural integrity layer 912 and second sacrificial layer 902 as shown in FIG. 9Q. In an example, mirror layer 918 is an aluminum alloy deposited by CVD or physical deposition. In other examples, mirror layer 918 is another material that provides good conductivity and good reflectivity. Also, as an example, second sacrificial layer 902 is subjected to a cleaning processes before deposition. Because mirror layer 918 on second sacrificial layer 902 is deposited in one deposition, this example method allows for a high-quality mirror layer 918. Mirror layer 918 is then patterned and etched to form an individual mirror.

Step 850 is removing first sacrificial layer 952 and second sacrificial layer 902. FIG. 9R shows that second sacrificial layer 902 and first sacrificial layer 952 are removed by selective isotropic etching. The remaining structure includes mirror 920, which is patterned from mirror layer 918, second structural integrity layer 912, and second conductive layer 910 over torsion bar layer 968. Second conductive layer 910 provides conduction from torsion bar layer 968 to mirror 920. Second structural integrity layer 912 provides a structural integrity to via 922. Torsion bar layer 968 allows for movement of mirror 920 with less stress on via 922. First conductive layer 960 provides conduction from torsion bar layer 968 to one or more contacts (not shown) in substrate 904. First structural integrity layer 962 provides additional strength to vias 970.

Figure 10:
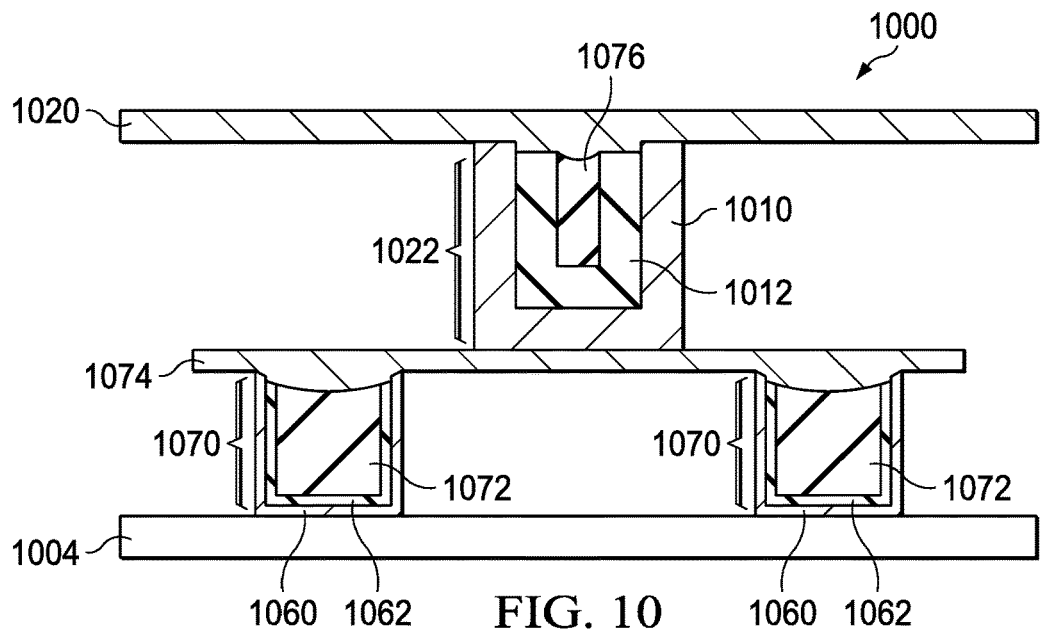
FIG. 10 is a diagram of another example MEMS device.

FIG. 10 shows another example MEMS device 1000. Examples of MEMS devices include sensors (e.g., temperature, pressure, gas, moisture, and motion sensors), accelerometers, valves, motors, actuators, and micromirrors. In this example, MEMS device 1000 is a micromirror. In this example, MEMS device 1000 is part of an integrated circuit. In other examples, MEMS device 1000 is not part of an integrated circuit or is part of a hybrid circuit package. First vias (posts) 1070 are over substrate 1004. First vias 1070 include first conductive layers 1060, first structural integrity layers 1062 and first fills 1072. First vias 1070 support torsion bar 1074. Second via 1022 is over torsion bar 1074, thus torsion bar 1074 serves as a substrate for second via 1022. Second via 1022 includes second conductive layer 1010, second structural integrity layer 1012 and second fill 1076. Second via 1022 supports mirror 1020. Second structural integrity layer 1012 provides structural integrity to second via 1022. Torsion bar 1074 allows for movement of mirror 1020 with less stress on second via 1022. First conductive layer 1060 provides conduction from torsion bar 1074 to one or more contacts (not shown) in substrate 1004. Second conduction layer 1010 provides conduction from mirror 1020 to torsion bar 1074. First structural integrity layers 1062 provide additional strength to first vias 1070.

Figure 11:
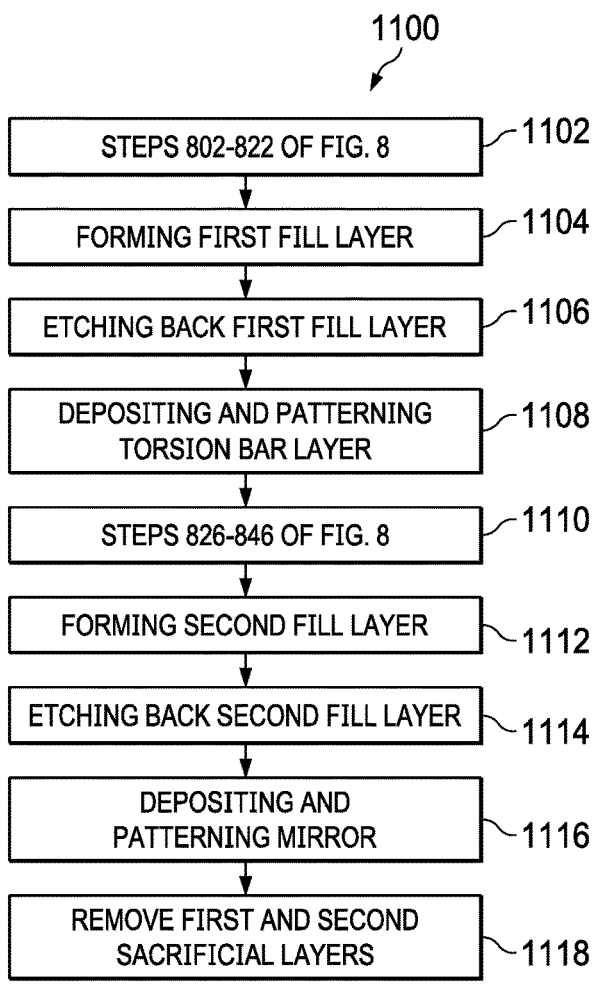
FIG. 11 is a flow diagram of an example process for forming the example MEMS device of FIG. 10.
Figure 12A:
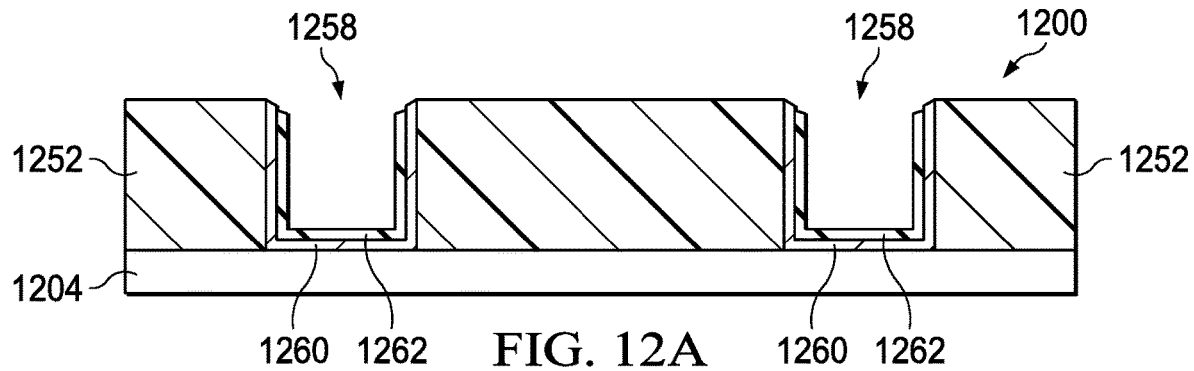
FIGS. 12A through 12I (collectively "FIG. 12") are diagrams illustrating the steps of the example process of FIG. 11 for forming the example micromirror of FIG. 10.

FIG. 11 is a flow diagram of an example process 1100, which is illustrated in FIGS. 12A through 12I (collectively "FIG. 12"). FIG. 12 shows the steps in forming MEMS device 1200, which is like MEMS device 1000 (FIG. 11). Step 1102 is forming the structure of FIG. 12A using steps 802 through 822 (FIG. 8). Substrate 1204 is like substrate 904 (FIG. 9). First sacrificial layer 1252 is like first sacrificial layer 952 (FIG. 9). First conductive layer 1260 is like first conductive layer 960 (FIG. 9). First structural integrity layer 1262 is like first structural integrity layer 962 (FIG. 9). The structure of FIG. 12A is like the structure of FIG. 9G.

Figure 12B:
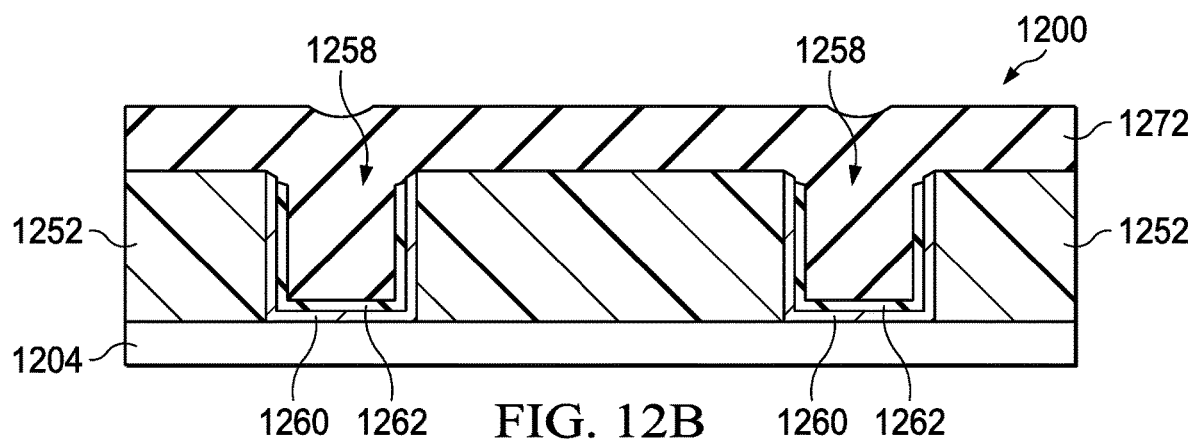
Figure 12C:
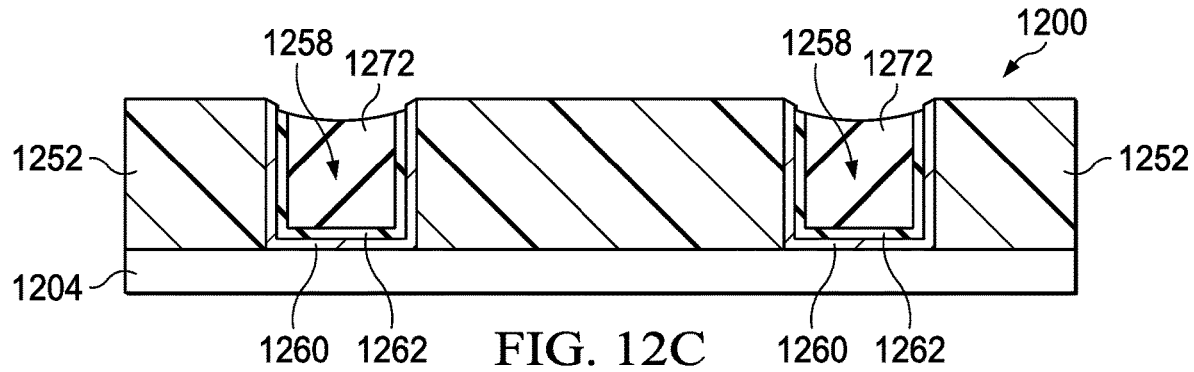

Step 1104 is forming a first fill layer 1272. First fill layer 1272 is formed as shown in FIG. 12B. First fill layer 1272 is one of, or a combination of, materials such as silicon dioxide, silicon nitride, titanium nitride, titanium, titanium-tungsten (TiW), photoresist, polyimide, germanium, germanium oxide, polycrystalline silicon, phosphor-silicate-glass (PSG), borophosphosilicate glass (BPSG) and spin-on-glass (SOG). The process for forming fill layer 1272 is dependent upon the material used. Step 1106 is etching back first fill layer 1272 to remove first fill layer 1272 except in opening 1258 as shown in FIG. 12C. In an alternative example, first structural integrity layer 1262 is formed to a thickness to fill openings 1258 and then etched back. With this example, first fill layer 1272 is not necessary. Step 1108 is depositing and patterning torsion bar layer 1268. For example, CVD or physical vapor deposition of aluminum forms torsion bar layer 1268 to a thickness of 200 to 400 Å, which is then patterned using a photolithographic mask to selectively remove portions of torsion bar layer 1268. The resulting patterned torsion bar layer 1268 is shown in FIG. 12D.

Figure 12D:
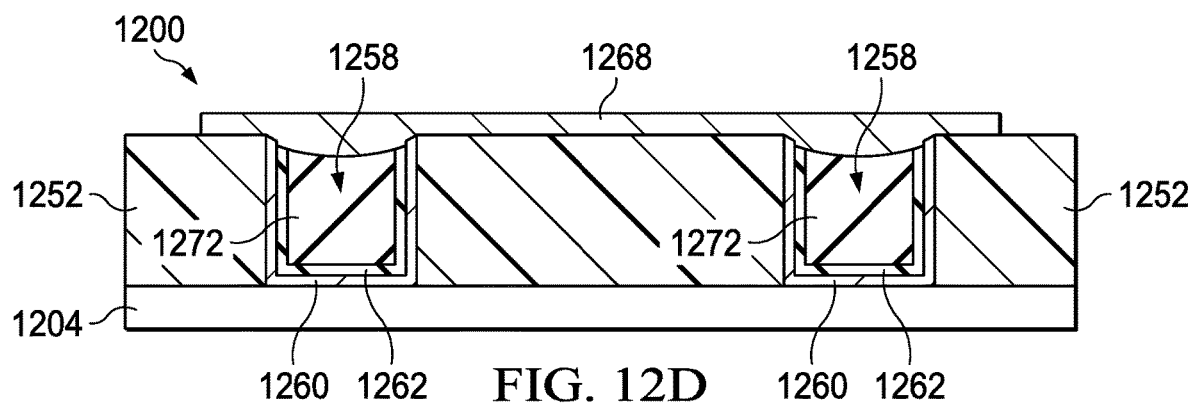
Figure 12E:
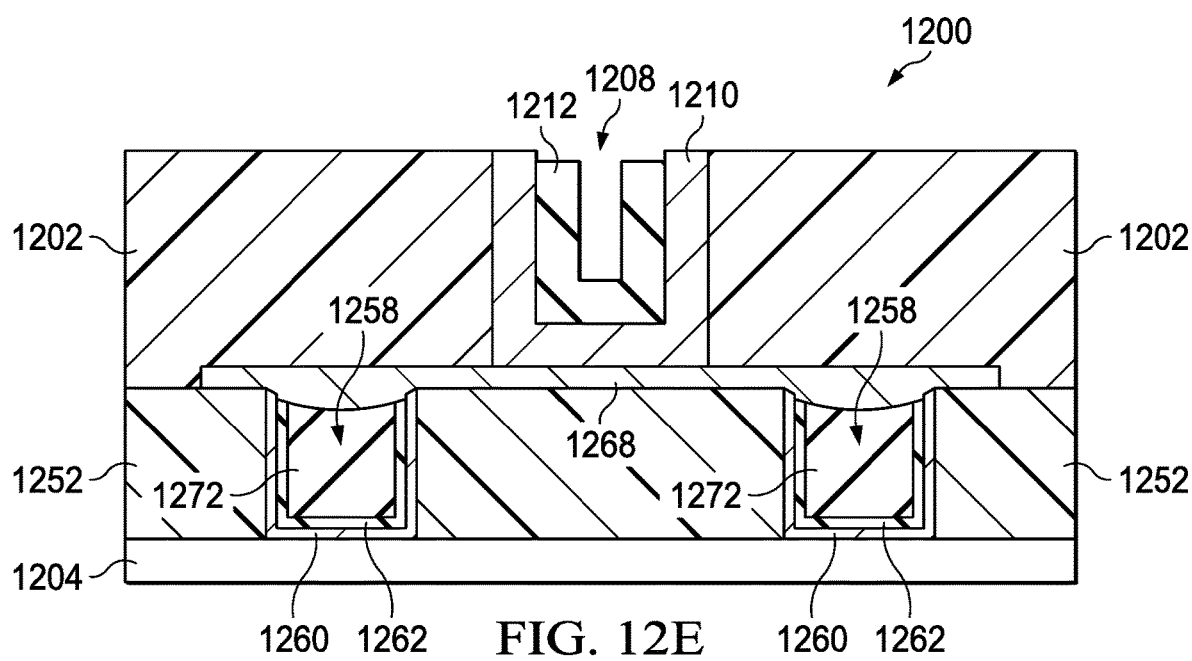

Step 1110 is forming the structure of FIG. 12E on the structure of FIG. 12D using steps 826 through 846 (FIG. 8). Second sacrificial layer 1202 is like second sacrificial layer 902 (FIG. 9). Second conductive layer 1210 is like second conductive layer 910 (FIG. 9). Second structural integrity layer 1212 is like second structural integrity layer 912 (FIG. 9).

Figure 12F:
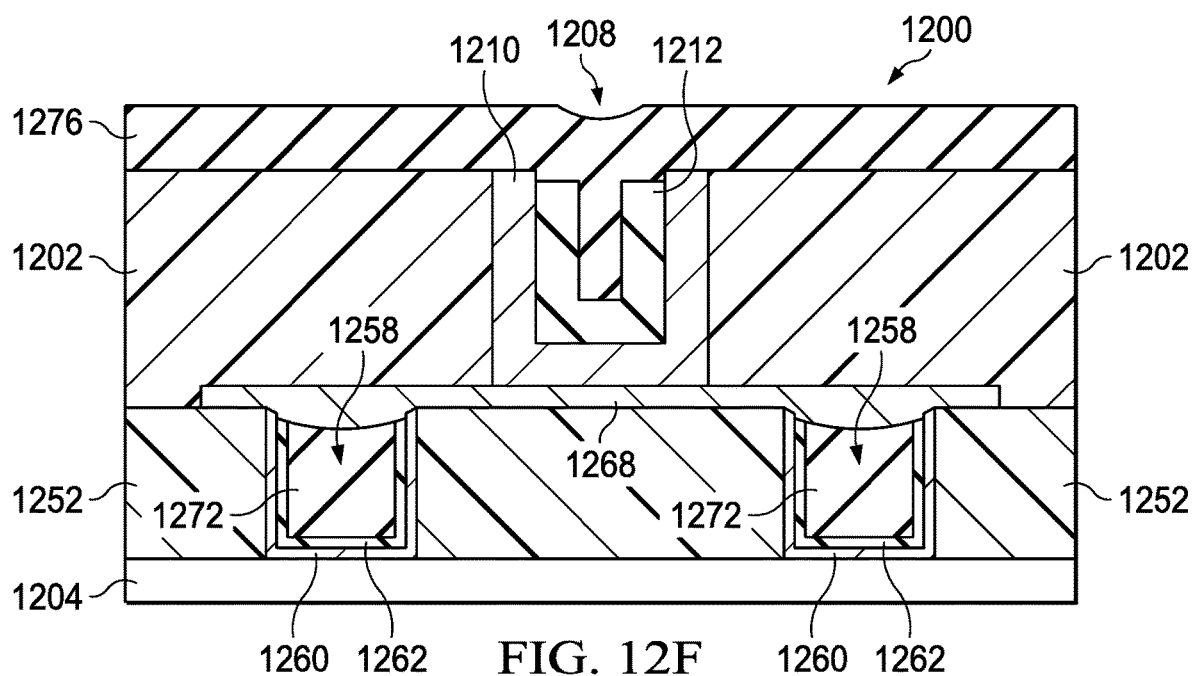
Figure 12G:
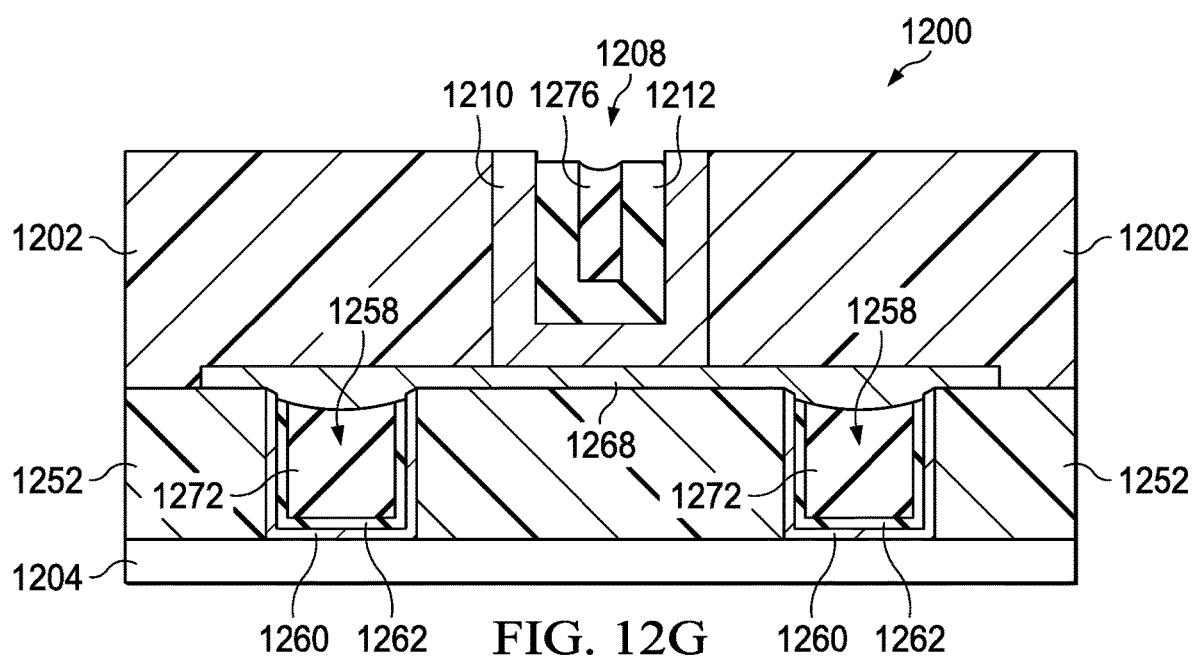
Figure 12H:
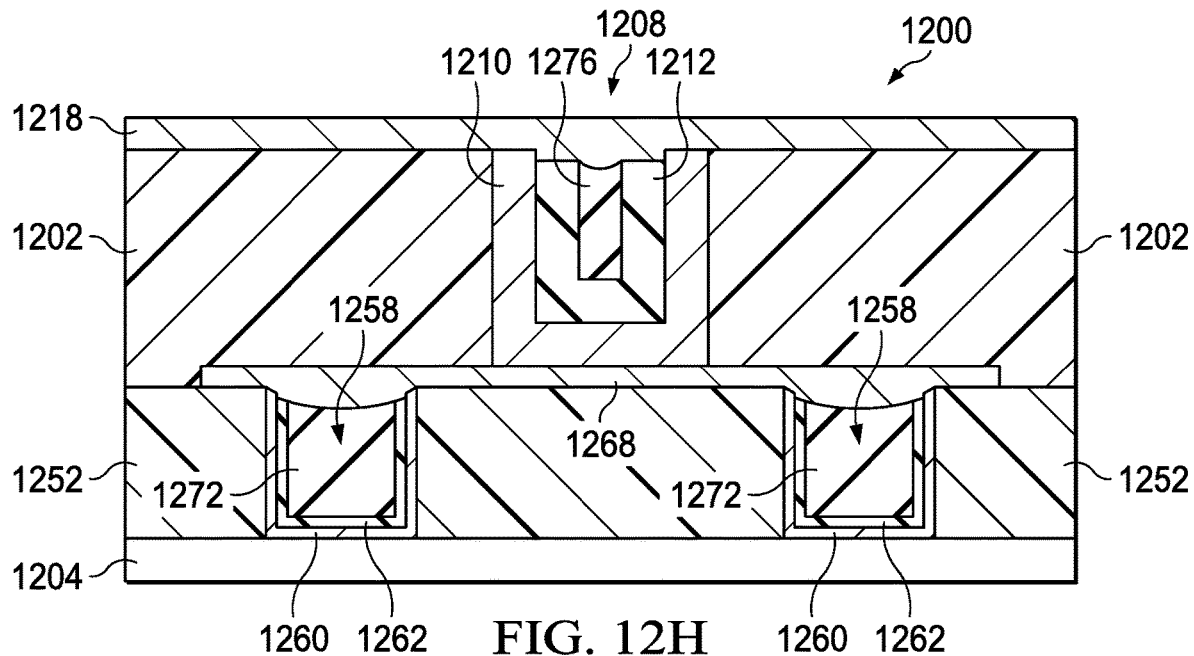

Step 1112 is forming a second fill layer 1276. Second fill layer 1276 is one of, or a combination of, materials such as silicon dioxide, silicon nitride, titanium nitride, titanium, titanium-tungsten (TiW), photoresist, polyimide, germanium, germanium oxide, polycrystalline silicon, phosphor-silicate-glass (PSG), borophospho-silicate glass (BPSG) and spin-on-glass (SOG). The process for forming fill layer 1276 is dependent upon the material used. The resulting fill layer 1276 is shown in FIG. 12F. Step 1114 is etching back second fill layer 1276 to remove second fill layer 1276 except in opening 1208 as shown in FIG. 12G. In an alternative example, second structural integrity layer 1212 is formed to a thickness to fill via 1208 and then etched back. With this example, second fill layer 1276 is not necessary. Step 1116 is depositing and patterning mirror layer 1218. For example, CVD or physical vapor deposition of an alloy of aluminum forms mirror layer 1218. The resulting mirror layer 1218 is shown in FIG. 12H. Mirror layer 1218 is then patterned and etched using photolithography.

Figure 12I:
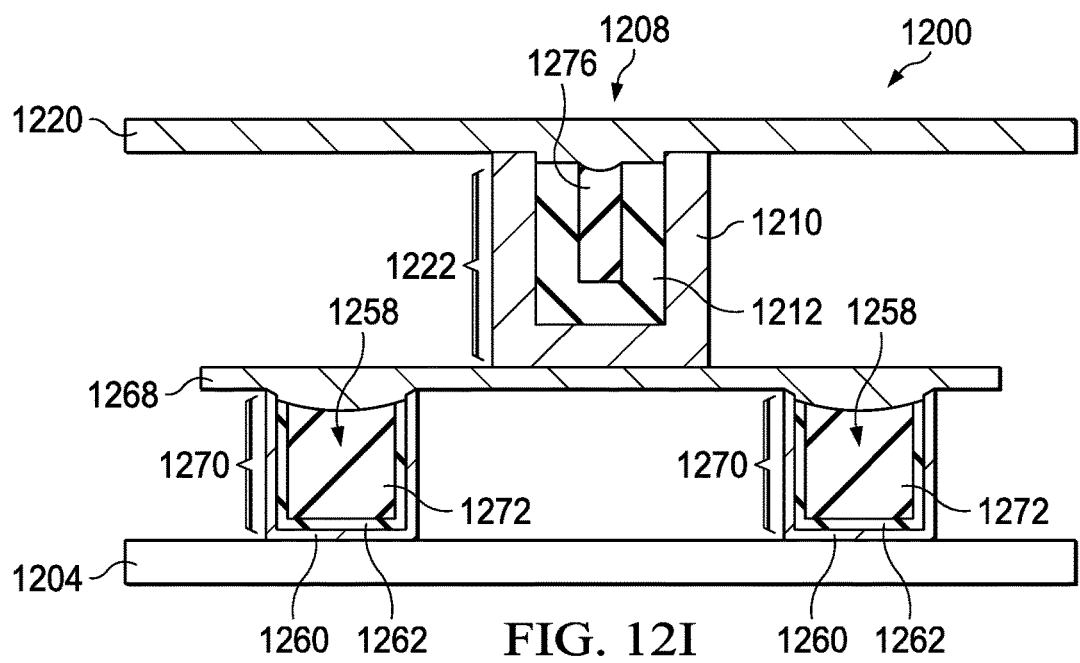

Step 1118 is removing first sacrificial layer 1252 and second sacrificial layer 1202. Selective isotropic etching removes second sacrificial layer 1202 and first sacrificial layer 1252 as shown in FIG. 12I. The remaining structure includes mirror 1220, which is patterned from mirror layer 1218, second structural integrity layer 1212, and second conductive layer 1210 over torsion bar layer 1268. Second conductive layer 1210 provides conduction from torsion bar layer 1268 to mirror 1220. Second structural integrity layer 1212 provides a structural integrity to via 1222. Torsion bar layer 1268 allows for movement of mirror 1220 with less stress on via 1222. First conductive layer 1260 provides conduction from torsion bar layer 1268 to one or more contacts (not shown) in substrate 1204. First structural integrity layers 1262 provide additional strength to vias 1270.

Modifications are possible in the described examples, and other examples are possible, within the scope of the claims.

What is claimed is:
1. A device comprising:
  a substrate;
  a MEMS element comprising a mirror layer, the mirror layer comprising:
    mirror regions;
    a bottom via portion; and via sidewalls between the mirror regions and the bottom via portion; and
a via between the MEMS element and the substrate, the via having:
a conductive layer comprising:
a bottom portion on the substrate; and
sidewalls having a top surface; and
a structural integrity layer comprising:
a bottom portion on the bottom portion of the conductive layer; and
sidewalls on the sidewalls of the conductive layer,
the bottom via portion of the mirror layer on the bottom portion of the structural integrity layer, and the via sidewalls of the mirror layer on the sidewalls of the structural integrity layer, the mirror regions of the mirror layer contacting the top surface of the sidewalls of the conductive layer.

2. The device of claim 1, wherein the conductive layer is selected from a group of titanium nitride and titanium-aluminum.

3. The device of claim 1, wherein the structural integrity layer is silicon dioxide.

4. The device of claim 1, wherein the MEMS element is an electrically-actuated, movable micromirror.

5. The device of claim 1, further comprising a fill layer extending into the structural integrity layer.

6. The device of claim 5, wherein the fill layer is selected from a group consisting of silicon dioxide, silicon nitride, titanium nitride, titanium, titanium-tungsten (TiW), photoresist, polyimide, germanium, germanium oxide, polycrystalline silicon, phosphor-silicate-glass (PSG), borophosphosilicate glass (BPSG) and spin-on-glass (SOG).

7. An integrated circuit comprising:
a substrate;
a mirror;
a torsion bar layer comprising a torsion bar;
a first via between the torsion bar and the substrate, the first via comprising:
a first conductive layer comprising:
a bottom portion; and
sidewalls; and
a first structural integrity layer comprising:
a bottom portion on the bottom portion of the first conductive layer; and
sidewalls on the sidewalls of the first conductive layer, the torsion bar layer extending into the first via; and
a second via between the mirror and the torsion bar, the second via comprising:
a second conductive layer between the torsion bar and the mirror; and
a second structural integrity layer on the second conductive layer.

8. The integrated circuit of claim 7, wherein the first conductive layer and the second conductive layer are selected from a group of titanium nitride and titanium-aluminum.

9. The integrated circuit of claim 7, wherein the first structural integrity layer and the second structural integrity layer are silicon dioxide.

10. The integrated circuit of claim 7, wherein the first structural integrity layer fills a portion of the first via not occupied by the first conductive layer.

11. The integrated circuit of claim 7, wherein the second structural integrity layer fills a portion of the second via not occupied by the second conductive layer.

12. The integrated circuit of claim 7, further comprising a first fill layer in the first via and second fill layer in the second via.

13. The integrated circuit of claim 12, wherein the first fill layer and the second fill layer are from a group consisting of silicon dioxide, silicon nitride, titanium nitride, titanium, titanium-tungsten (TiW), photoresist, polyimide, germanium, germanium oxide, polycrystalline silicon, phosphor-silicate-glass (PSG), borophosphosilicate glass (BPSG) and spin-on-glass (SOG).

14. The integrated circuit of claim 7, further comprising a third via between the torsion bar and the substrate, the third via having a third conductive layer extending from the substrate to the torsion bar and having a third structural integrity layer on the third conductive layer.

15. The integrated circuit of claim 14, wherein the third structural integrity layer fills a portion of the third via not occupied by the third conductive layer.

16. The integrated circuit of claim 14, further comprising a third fill layer in the third via.

17. The integrated circuit of claim 16, wherein the third fill layer is from a group including silicon dioxide, silicon nitride, titanium nitride, titanium, titanium-tungsten (TiW), photoresist, polyimide, germanium, germanium oxide, polycrystalline silicon, phosphor-silicate-glass (PSG), borophosphosilicate glass (BPSG) and spin-on-glass (SOG).

18. The integrated circuit of claim 7, wherein the torsion bar layer comprises a bottom portion on the bottom portion of the first structural integrity layer and sidewalls on sidewalls of the first structural integrity layer.

19. A device comprising:
a substrate layer;
a via having:
a conductive layer, the conductive layer comprising:
a bottom portion on the substrate layer; and
sidewalls having a top surface; and
a structural integrity layer comprising:
a bottom portion on the bottom portion of the conductive layer; and
sidewalls on the sidewalls of the conductive layer; and
a mirror layer, the mirror layer comprising:
mirror regions;
a bottom via portion on the bottom portion of the structural integrity layer; and
via sidewalls on the sidewalls of the structural integrity layer, the via sidewalls between the mirror regions and the bottom via portion, the mirror regions of the mirror layer contacting the top surface of the sidewalls of the conductive layer.

20. The device of claim 19, wherein the via further comprises a fill layer on the bottom portion of the structural integrity layer between the sidewalls of the structural integrity layer.

* * * * *